(12) United States Patent
Kameyama et al.

(10) Patent No.: US 8,077,753 B2
(45) Date of Patent: Dec. 13, 2011

(54) SEMICONDUCTOR LASER DEVICE

(75) Inventors: Shingo Kameyama, Ibaraki (JP);
Yoshiki Murayama, Hirakata (JP)

(73) Assignee: Sanyo Electric Co., Ltd., Osaka (JP)

( * ) Notice: Subject to any disclaimer, the term of this patent is extended or adjusted under 35 U.S.C. 154(b) by 43 days.

(21) Appl. No.: 12/594,098

(22) PCT Filed: Feb. 9, 2009

(86) PCT No.: PCT/JP2009/052128
§ 371 (c)(1),
(2), (4) Date: Sep. 30, 2009

(87) PCT Pub. No.: WO2009/101911
PCT Pub. Date: Aug. 20, 2009

(65) Prior Publication Data
US 2010/0118908 A1    May 13, 2010

(30) Foreign Application Priority Data

Feb. 15, 2008    (JP) .................... 2008-034248
Feb. 3, 2009     (JP) .................... 2009-022572

(51) Int. Cl.
*H01S 5/00* (2006.01)
(52) U.S. Cl. .................... 372/49.01; 372/43.01
(58) Field of Classification Search .............. 372/49.01, 372/43.01
See application file for complete search history.

(56) References Cited

U.S. PATENT DOCUMENTS 7,792,169 B2 * 9/2010 Kawaguchi et al. ....... 372/43.01

| 2005/0281304 | A1 | 12/2005 | Mochida |
| 2006/0133442 | A1 | 6/2006 | Kondou et al. |
| 2007/0001578 | A1 | 1/2007 | Iki et al. |
| 2007/0025231 | A1 | 2/2007 | Ochiai et al. |
| 2007/0080368 | A1 | 4/2007 | Kamikawa et al. |
| 2007/0205424 | A1 * | 9/2007 | Kamikawa et al. ............. 257/94 |
| 2008/0181275 | A1 * | 7/2008 | Matsuyama et al. ...... 372/45.011 |
| 2008/0219314 | A1 * | 9/2008 | Yoshida .................... 372/49.01 |

FOREIGN PATENT DOCUMENTS

| JP | 2005-303272 A | 10/2005 |
| JP | 2006-203162 A | 8/2006 |

(Continued)

OTHER PUBLICATIONS

International Search Report for PCT/JP2009/052128, dated Mar. 10, 2009, pp. 1-5.

*Primary Examiner* — Kinam Park

(74) *Attorney, Agent, or Firm* — Ditthavong Mori & Steiner, P.C.

(57) ABSTRACT

A semiconductor laser device capable of improving the reliability of the laser device is obtained. This semiconductor laser device (1000) includes a semiconductor element layer (20) having a light emitting layer (25), a first cavity facet (1) formed on an end portion on a light emitting side of a region of the semiconductor element layer including the light emitting layer, a first insulating film (40) in which a first nitride film (41), a first intermediate film including a first oxide film (42) and a second nitride film (43) are formed on the first cavity facet in this order from the side of the first cavity facet and a second insulating film (51), formed on the first insulating film, including a second oxide film (51).

20 Claims, 4 Drawing Sheets

FOREIGN PATENT DOCUMENTS

| | | |
|---|---|---|
| JP | 2006-351966 A | 12/2006 |
| JP | 2007-59897 A | 3/2007 |
| JP | 2007-103814 A | 4/2007 |
| JP | 2007-109737 A | 4/2007 |
| JP | 2007-243023 A | 9/2007 |
| JP | 2007-273951 A | 10/2007 |
| WO | WO 2009/101911 A1 | 8/2009 |

* cited by examiner

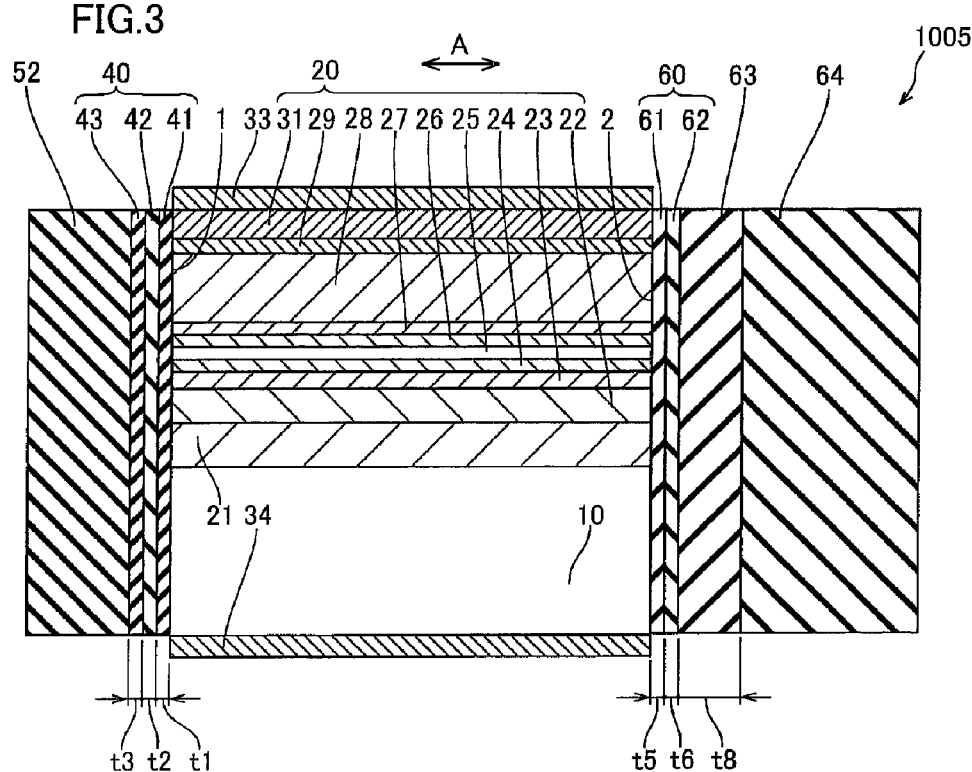
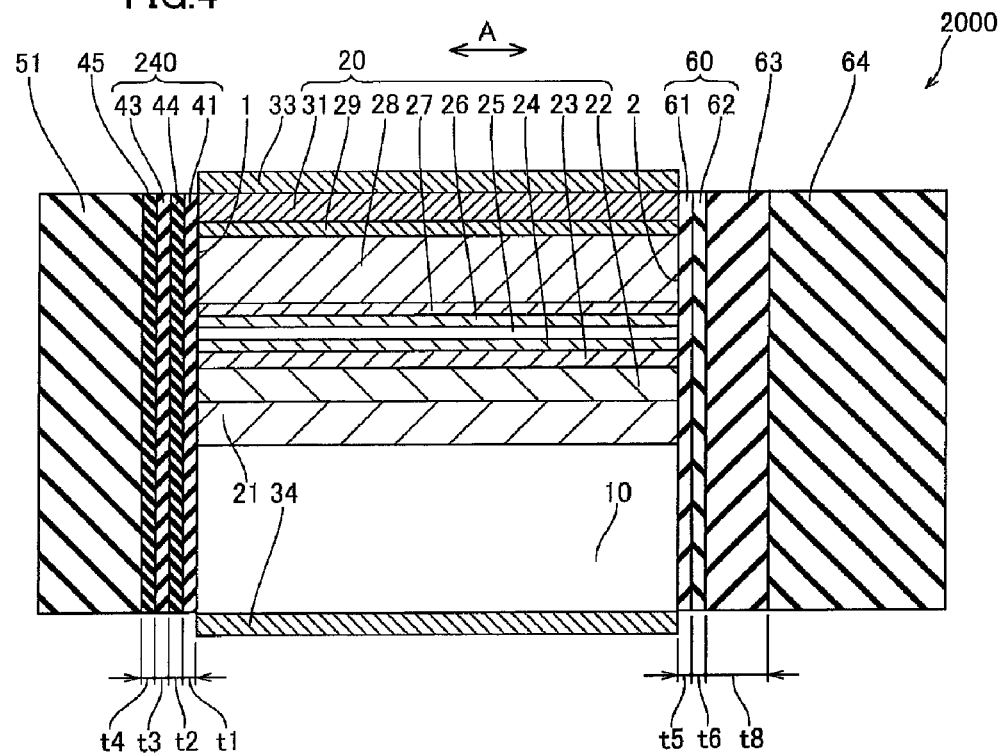

US 8,077,753 B2

SEMICONDUCTOR LASER DEVICE

TECHNICAL FIELD

The present invention relates to a semiconductor laser device, and more particularly, it relates to a semiconductor laser device including a semiconductor element layer having a light emitting layer.

BACKGROUND ART

In general, a semiconductor laser is widely employed as the light source of an optical disk system or an optical communication system. Following improvement in performance of apparatuses constituting the system, characteristic improvement of the semiconductor laser as an elemental component is demanded. In particular, wavelength shortening and higher output of a laser beam are desired as the light source of a high-density optical disk system, and a violet semiconductor laser having a lasing wavelength of about 405 nm has recently been developed with a nitride-based material, while higher output thereof is examined.

In general, facet coating treatment of setting a light emitting surface in a cavity of a semiconductor laser device to a low reflectance while setting a light reflecting surface to a high reflectance is performed in a manufacturing process in a case of providing the semiconductor laser with higher output. In a general semiconductor laser, a dielectric film consisting of an oxide film of $SiO_2$ or $Al_2O_3$ has generally been employed for the facet coating treatment of the cavity. In this case, however, oxygen in the dielectric film diffuses into a semiconductor layer to oxidize the semiconductor layer during oscillation of a laser beam, and a non-radiative recombination level (state where light emission energy is converted to thermal energy) is generated on the interface between the semiconductor layer and a facet coating film. Consequently, the laser beam is easily absorbed by the semiconductor layer or the facet coating film, and there is such a disadvantage that catastrophic optical damage (COD) results from abnormal heat generation of the cavity facet. Facet coating treatment with a dielectric film consisting of a nitride film having no oxygen is proposed. In general, however, stress possessed by the nitride film is larger by several times to several 10 times as compared with a case of an oxide film and hence film separation (peeling) easily takes place, and there is also a disadvantage of causing cracking or peeling on the cavity facet as a result.

Therefore, a proposal for forming a thin film of a nitride between the semiconductor layer and the facet coating film consisting of an oxide film is made in general. Such a semiconductor laser device is disclosed in Japanese Patent Laying-Open No. 2007-243023, for example.

In the aforementioned Japanese Patent Laying-Open No. 2007-243023, there is disclosed a nitride semiconductor light-emitting device in which a first coating film made of an oxide is formed on a cavity facet on a light emitting side while a second coating film made of a nitride is formed to be held between the cavity facet on the light emitting side and the first coating film. In this nitride semiconductor light-emitting device described in Japanese Patent Laying-Open No. 2007-243023, supply of oxygen from the first coating film on the outermost surface exposed to the atmosphere to a semiconductor layer (cavity facet on the light emitting side) is suppressed by the second coating film made of a nitride formed to be in contact with the cavity facet.

In the nitride semiconductor light-emitting device disclosed in the aforementioned Japanese Patent Laying-Open No. 2007-243023, however, a high-energy laser beam of a large optical density having a wavelength of about 400 nm is emitted from the cavity facet, and hence heat generation is caused in the first coating film and the second coating film through which the laser beam is transmitted. In this case, oxygen desorbs from the first coating film made of an oxide due to the heat generation on the interface between the first coating film and the second coating film. Further, oxygen in the atmosphere is transmitted through the first coating film and easily incorporated into the second coating film made of a nitride, and hence nitrogen of the second coating film and oxygen desorbing from the outside and the first coating film are substituted for each other. Thus, the interface between the first coating film and the second coating film causes alteration. The reaction rate at which oxygen desorbs from the first coating film made of an oxide is larger than the reaction rate of the substitution between nitrogen and oxygen in the second coating film. Therefore, the first coating film starts to gradually deteriorate following emission of the laser beam. Consequently, the operating current of the laser device is increased, and the cavity facet is easily broken due to further heat generation following the increase in the operating current. Particularly in a semiconductor laser provided with higher output, the aforementioned point gets remarkable as the operating time of the laser lengthens, and hence there is such a problem that the reliability of the laser device lowers.

DISCLOSURE OF THE INVENTION

The present invention has been proposed in order to solve the aforementioned problems, and an object of the present invention is to provide a semiconductor laser device capable of improving the reliability of the laser device.

A semiconductor laser device according to an aspect of the present invention includes a semiconductor element layer having a light emitting layer, a first cavity facet formed on an end portion on a light emitting side of a region of the semiconductor element layer including the light emitting layer, a first insulating film in which a first nitride film, a first intermediate film including at least one of a first oxide film and a first oxynitride film and a second nitride film are formed on the first cavity facet in this order from the side of the first cavity facet and a second insulating film, formed on the first insulating film, including at least one of a second oxide film and a second oxynitride film, while the thickness t1 of the first nitride film, the thickness t2 of the first intermediate film and the thickness t3 of the second nitride film are set to be $t1 < \lambda/(4 \times n1)$, $t2 < \lambda/(4 \times n2)$ and $t3 < \lambda/(4 \times n3)$ respectively when the wavelength of a laser beam emitted by the light emitting layer is $\lambda$ and the refractive index of the first nitride film, the average refractive index of the first intermediate film and the refractive index of the second nitride film are n1, n2 and n3 respectively.

In the present invention, the cavity facet on the light emitting side is distinguished by the large-small relation between the intensity levels of laser beams emitted from cavity facets formed in a pair respectively. In other words, the side on which the emission intensity of the laser beam is relatively large is the first cavity facet on the light emitting side. The side on which the emission intensity of the laser beam is relatively small is a second cavity facet on a light reflecting side.

As hereinabove described, the semiconductor laser device according to the aspect of the present invention includes the first insulating film in which the first nitride film, the first intermediate film including at least one of the first oxide film and the first oxynitride film and the second nitride film are formed in this order from the side of the first cavity facet on the first cavity facet on the light emitting side. Thus, oxygen present in the second insulating film and in the atmosphere is hardly incorporated into the first insulating film due to the second nitride film arranged on the outer side, whereby desorption of oxygen on the interface between the first intermediate film and the first nitride film and displacement reaction between oxygen and nitrogen are suppressed. In other words, the interface between the first intermediate film and the first nitride film is suppressed from alteration and deterioration. Even if alteration takes place on the interface between the first intermediate film and the first nitride film, an alteration region spreading in the first intermediate film can be kept within this region due to the first nitride film and the second nitride film, whereby extension of the alteration is suppressed. Thus, alteration of the first insulating film can be suppressed to the minimum. Therefore, heat generation in the vicinity of the first cavity facet on the light emitting side and the first insulating film is suppressed even if the beam emitted from the laser has higher output, whereby breakage of the first cavity facet is suppressed. Consequently, the reliability of the laser device can be improved.

Further, the reflectance for the laser beam emitted from the first cavity facet on the light emitting side can be easily controlled by adjusting the thickness of the second insulating film including at least one of the second oxide film and the second oxynitride film formed on the first insulating film, i.e., on the surface of the first insulating film positioned on the side opposite to the first cavity facet. Thus, the reliability of the laser device corresponding to higher output can be improved.

In addition, the thickness t1 of the first nitride film constituting the first insulating film, the thickness t2 of the first intermediate film and the thickness t3 of the second nitride film are set to be $t1 < \lambda/(4 \times n1)$, $t2 < \lambda/(4 \times n2)$ and $t3 < \lambda/(4 \times n3)$ respectively, whereby the thicknesses of the respective films constituting the first insulating film are smaller than $\lambda/(4 \times n)$. Thus, the laser beam emitted from the first cavity facet on the light emitting side is transmitted without being influenced by the thicknesses of the respective films constituting the first insulating film and reaches the second insulating film. Consequently, a reflectance controlling function of the second insulating film set to have a desired reflectance can be easily suppressed from being influenced by the first insulating film. Further, the thicknesses of the respective films constituting the first insulating film are small, whereby film separation (peeling) or the like resulting from stress after film formation can also be suppressed.

In the semiconductor laser device according to the aforementioned aspect, the first nitride film is preferably in contact with the semiconductor element layer. According to this structure, the first nitride film is in contact with the first cavity facet on the light emitting side, whereby oxygen from at least one of the first oxide film and the first oxynitride film in the first intermediate film can be easily suppressed from being incorporated into the semiconductor element layer, due to the first nitride film.

In the semiconductor laser device according to the aforementioned aspect, at least one of the first nitride film and the second nitride film and the first intermediate film preferably contain the same metallic element. According to this structure, at least either the first nitride film and the first intermediate film in contact with each other or the second nitride film and the first intermediate film in contact with each other are materials containing the same type of metallic element, whereby adhesiveness at the time of contact can be improved. Consequently, film separation (peeling) of at least one of the first nitride film and the second nitride film can be suppressed.

In the semiconductor laser device according to the aforementioned aspect, the first nitride film and the second nitride film preferably contain at least one of Al and Si respectively. According to this structure, the insulating properties of the first nitride film and the second nitride film can be improved since nitrides containing at least one of Al and Si have excellent insulating properties. Further, incorporation of oxygen into the first insulating film and the semiconductor element layer can be effectively suppressed due to the nitride films containing at least one of Al and Si.

In the semiconductor laser device according to the aforementioned aspect, the first oxide film preferably contains at least one element selected from the group consisting of Al, Si, Zr, Ta, Hf and Nb. According to this structure, the insulating property of the first oxide film can be improved since an oxide containing the aforementioned element has an excellent insulating property. When the first oxide film as well as the first nitride film and the second nitride film holding the first oxide film therebetween from both sides contain a common element selected from the aforementioned group together, adhesiveness between the first oxide film and each of the first nitride film and the second nitride film can be improved.

In the semiconductor laser device according to the aforementioned aspect, the first oxynitride film preferably contains at least one of Al and Si. According to this structure, the insulating property of the first oxynitride film can be improved since an oxide containing at least one of Al and Si has an excellent insulating property. When a first oxynitride film containing an Al element is held by a first nitride film and a second nitride film containing an Al element from both sides, the respective films can be easily brought into contact with each other due to the same type of metallic element (Al element), whereby adhesiveness between the respective films can be improved.

In the semiconductor laser device according to the aforementioned aspect, a second intermediate film including at least one of a third oxide film and a third oxynitride film is preferably further formed between the first insulating film and the second insulating film. According to this structure, a region consisting of the first nitride film and at least one of the first oxide film and the first oxynitride film and a region consisting of the second nitride film and at least one of the third oxide film and the third oxynitride film are formed on the first cavity facet on the light emitting side successively from the side closer to the first cavity facet on the light emitting side and multilayered, whereby breakage of the first cavity facet can be further suppressed.

In this case, the second intermediate film is preferably so set that $t4 < \lambda/(4 \times n4)$ when the average refractive index thereof is n4 and the thickness is t4. According to this structure, the thickness of the second intermediate film is smaller than $\lambda/(4 \times n)$, whereby the laser beam emitted from the first cavity facet on the light emitting side is transmitted without being influenced by the thickness of the second intermediate film and reaches the second insulating film. Thus, the reflectance controlling function of the second insulating film set to have the desired reflectance can be easily suppressed from being influenced by the second intermediate film.

In the semiconductor laser device according to the aforementioned aspect, the first intermediate film preferably includes both of the first oxide film and the first oxynitride film. In other words, both of the first oxide film and the first oxynitride film are formed between the first nitride film and the second nitride film. According to this structure, oxygen present in the second insulating film and in the atmosphere is more hardly incorporated into the first insulating film, whereby the interface between the first intermediate film and the first nitride film can be further suppressed from alteration and deterioration.

In the aforementioned structure in which the first intermediate film includes the first oxide film and the first oxynitride film, the first intermediate film preferably consists of the first oxide film and two first oxynitride films holding the first oxide film therebetween in the stacking direction. According to this structure, the first insulating film is stacked in the order of a nitride film, an oxynitride film, an oxide film, an oxynitride film and a nitride film, whereby it follows that the composition in the first insulating film gradually changes. Consequently, adhesiveness between the respective films in the first insulating film can be further improved, whereby the strength of the first insulating film consisting of a plurality of thin films can be maintained.

The semiconductor laser device according to the aforementioned aspect preferably further includes a second cavity facet formed on an end portion on a light reflecting side of the region of the semiconductor element layer including the light emitting layer and a third insulating film in which a third nitride film, a third intermediate film including at least one of a fourth oxide film and a fourth oxynitride film and a fourth nitride film are formed on the second cavity facet in this order from the side of the second cavity facet. According to this structure, oxygen from the atmosphere is hardly incorporated into the third insulating film due to the fourth nitride film, whereby the interface between the third intermediate film and the third nitride film is suppressed from alteration and deterioration. Therefore, heat generation in the second cavity facet on the light reflecting side and the third insulating film is suppressed even if the beam emitted from the laser has higher output, and breakage of the second cavity facet is also suppressed. Consequently, the reliability of the laser device can be further improved.

In the aforementioned structure further including the third insulating film, the thickness t5 of the third nitride film, the thickness t6 of the third intermediate film and the thickness t7 of the fourth nitride film are preferably set to be t5<λ/(4×n5), t6<λ/(4×n6) and t7<λ/(4×n7) respectively when the refractive index of the third nitride film, the average refractive index of the third intermediate film and the refractive index of the fourth nitride film are n5, n6 and n7 respectively. According to this structure, the thicknesses of the respective films constituting the third insulating film are smaller than λ/(4×n) when a reflecting film or the like reflecting the laser beam is provided on the third insulating film, i.e., on the surface of the third insulating film positioned on the side opposite to the second cavity facet on the light reflecting side, for example. Thus, the laser beam emitted from the second cavity facet on the light reflecting side is transmitted without being influenced by the thicknesses of the respective films constituting the third insulating film and reaches the reflecting film, whereby a reflectance controlling function of the reflecting film set to have a desired reflectance can be easily suppressed from being influenced by the third insulating film. Further, the thicknesses of the respective films constituting the third insulating film are small, whereby film separation (peeling) or the like resulting from stress after film formation can also be suppressed.

In the aforementioned structure further including the third insulating film, the third nitride film is preferably in contact with the semiconductor element layer. According to this structure, the third nitride film is in contact with the second cavity facet on the light reflecting side, whereby oxygen from at least one of the fourth oxide film and the fourth oxynitride film in the third intermediate film can be easily suppressed from being incorporated into the semiconductor element layer, due to the third nitride film.

In the aforementioned structure further including the third insulating film, at least one of the third nitride film and the fourth nitride film and the third intermediate film preferably contain the same metallic element. According to this structure, at least either the third nitride film and the third intermediate film in contact with each other or the fourth nitride film and the third intermediate film in contact with each other are materials containing the same type of metallic element, whereby adhesiveness at the time of contact can be improved. Consequently, film separation (peeling) of at least one of the third nitride film and the fourth nitride film can be suppressed.

In the aforementioned structure further including the third insulating film, the third nitride film and the fourth nitride film preferably contain at least one of Al and Si respectively. According to this structure, the insulating properties of the third nitride film and the fourth nitride film can be improved since nitrides containing at least one of Al and Si have excellent insulating properties. Further, oxygen can be effectively suppressed from being incorporated into the third insulating film and the semiconductor element layer, due to the nitride films containing at least one of Al and Si.

In the aforementioned structure further including the third insulating film, the fourth oxide film preferably contains at least one element selected from the group consisting of Al, Si, Zr, Ta, Hf and Nb. According to this structure, the insulating property of the fourth oxide film can be improved since an oxide containing the aforementioned element has an excellent insulating property. When the fourth oxide film as well as the third nitride film and the fourth nitride film holding the fourth oxide film therebetween from both sides contain a common element selected from the aforementioned group together, adhesiveness between the fourth oxide film and each of the third nitride film and the fourth nitride film can be improved.

In the aforementioned structure further including the third insulating film, the fourth oxynitride film preferably contains at least one of Al and Si. According to this structure, the insulating property of the fourth oxynitride film can be improved since an oxide containing at least one of Al and Si has an excellent insulating property. When a fourth oxynitride film containing an Al element is held by a third nitride film and a fourth nitride film identically containing an Al element from both sides, adhesiveness between the respective films can be improved.

In the aforementioned structure further including the third insulating film, the semiconductor laser device preferably further includes a multilayer reflecting film formed on the third insulating film. According to this structure, the reflectance for the laser beam emitted from the second cavity facet on the light reflecting side can be easily controlled by adjusting the thickness of the multilayer reflecting film.

In the semiconductor laser device according to the aforementioned aspect, the semiconductor element layer is preferably made of a nitride-based semiconductor. According to this structure, breakage of the first cavity facet on the light emitting side resulting from heat generation in laser beam emission can be effectively suppressed in a nitride-based semiconductor laser beam having a short lasing wavelength of not more than about 525 nm and emitting a high-energy laser beam.

In the semiconductor laser device according to the aforementioned aspect, the first nitride film, the first intermediate film and the second nitride film preferably have thicknesses in the range of at least 1 nm and not more than 20 nm respectively. According to this structure, the reflectance controlling function of the second insulating film can be more easily suppressed from being influenced by the first insulating film, and film separation (peeling) or the like of each film can also be further suppressed.

BRIEF DESCRIPTION OF THE DRAWINGS

FIG. 3 A sectional view of a semiconductor laser device on a surface along a cavity direction, for illustrating the structure of a semiconductor laser device according to a first modification of the first embodiment of the present invention.

FIG. 4 A sectional view of a semiconductor laser device on a surface along a cavity direction, for illustrating the structure of a semiconductor laser device according to a second embodiment of the present invention.

BEST MODES FOR CARRYING OUT THE INVENTION

Embodiments of the present invention are now described with reference to the drawings.

First Embodiment

First, the structure of a nitride-based semiconductor laser device 1000 according to a first embodiment of the present invention is described with reference to FIG. 1 and FIG. 2.

Figure 2:
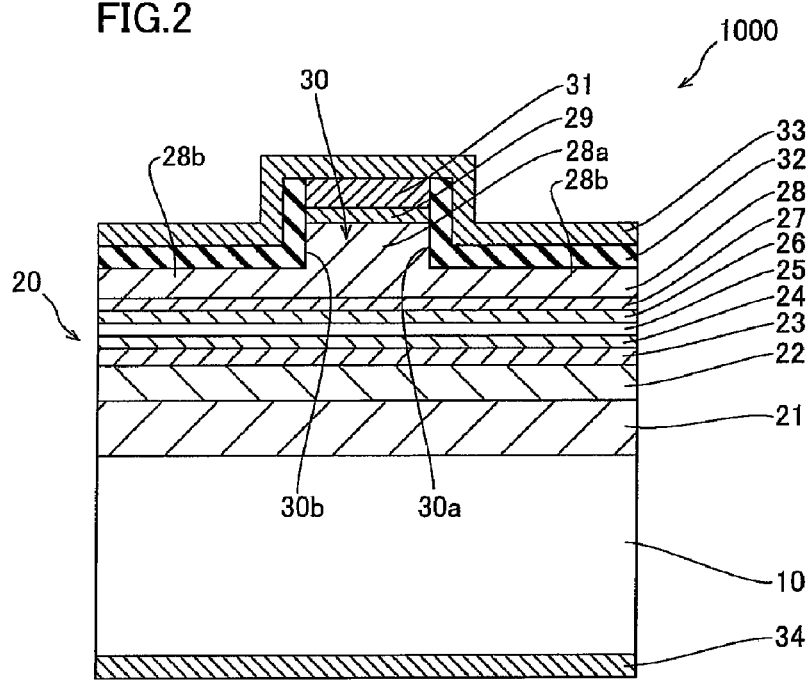
FIG. 2 A sectional view of the nitride-based semiconductor laser device shown in FIG. 1 on a surface orthogonal to the cavity direction.

In the nitride-based semiconductor laser device 1000 according to the first embodiment of the present invention, a semiconductor element layer 20 made of nitride-based semiconductors having a lasing wavelength λ in the band of about 405 nm is formed on a substrate 10, having a thickness of about 100 μm, made of n-type GaN doped with Si having a carrier concentration of about $5 \times 10^{18}$ cm$^{-3}$, as shown in FIG. 2.

Figure 1:
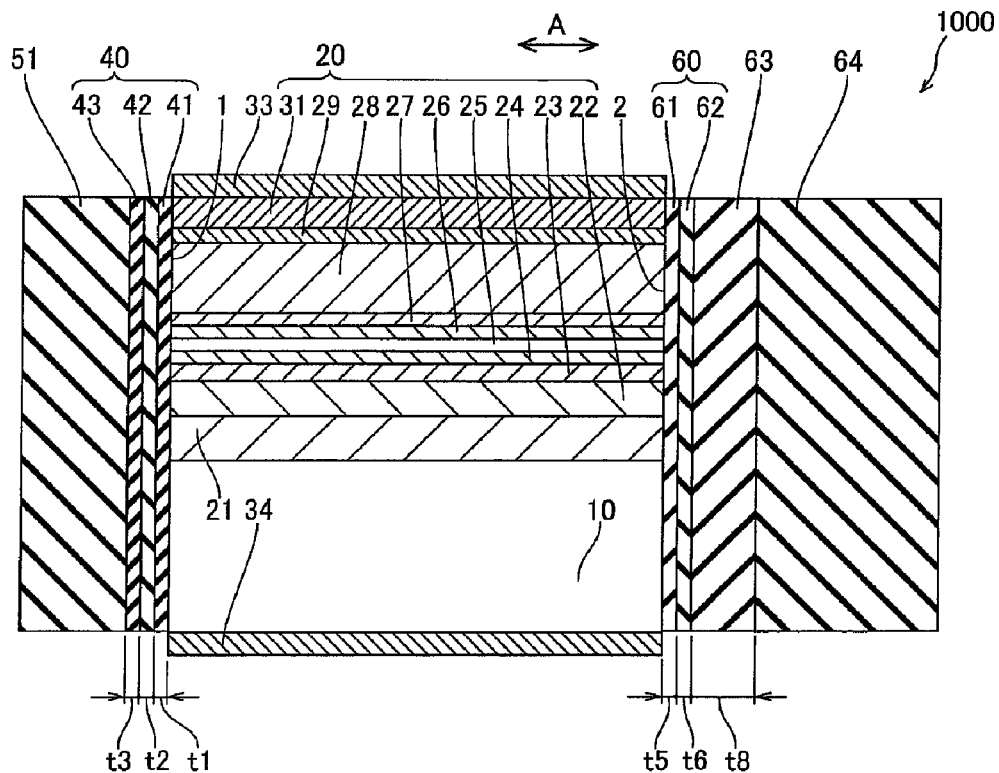
FIG. 1 A sectional view of a semiconductor laser device on a surface along a cavity direction, for illustrating the structure of a semiconductor laser device according to a first embodiment of the present invention.

In the nitride-based semiconductor laser device 1000, a light emitting surface 1 and a light reflecting surface 2 are formed on both end portions of an extensional direction (direction A) of a cavity respectively, as shown in FIG. 1. The light emitting surface 1 is an example of the "first cavity facet" in the present invention, and the light reflecting surface 2 is an example of the "second cavity facet" in the present invention. Facet coating films are formed on the light emitting surface 1 and the light reflecting surface 2 of the nitride-based semiconductor laser device 1000 respectively, by facet coating treatment in a manufacturing process.

According to the first embodiment, a first alteration preventing layer 40 which is such a dielectric multilayer film that an AlN film 41 having a thickness of about 10 nm in contact with the light emitting surface 1, an Al$_2$O$_3$ film 42 having a thickness of about 10 nm in contact with the AlN film 41 and an AlN film 43 having a thickness of about 10 nm in contact with the Al$_2$O$_3$ film 42 are stacked successively from the side closer to the light emitting surface 1 is formed on the light emitting surface 1 of the nitride-based semiconductor laser device 1000, as shown in FIG. 1. An Al$_2$O$_3$ film 51 having a thickness of about 70 nm is formed on the first alteration preventing layer 40, to be in contact with the first alteration preventing layer 40. The first alteration preventing layer 40 is an example of the "first insulating film" in the present invention. The AlN film 41 is an example of the "first nitride film" in the present invention, the Al$_2$O$_3$ film 42 is an example of the "first oxide film" or the "first intermediate film" in the present invention, and the AlN film 43 is an example of the "second nitride film" in the present invention. Further, the Al$_2$O$_3$ film 51 is an example of the "second oxide film" or the "second insulating film" in the present invention. According to the first embodiment, the AlN film 41, the Al$_2$O$_3$ film 42 and the AlN film 43 have functions of suppressing the first alteration preventing layer 40 itself and the light emitting surface 1 from altering following emission of a laser beam. The Al$_2$O$_3$ film 51 has a function of controlling a reflectance, and the light emitting surface 1 is set to have a reflectance of about 8% for the laser beam due to the Al$_2$O$_3$ film 51.

According to the first embodiment, the thickness t1 (=about 10 nm) of the AlN film 41, the thickness t2 (=about 10 nm) of the Al$_2$O$_3$ film 42 and the thickness t3 (=about 10 nm) of the AlN film 43 are set to have the relations of t1<λ/(4×n1), t2<λ/(4×n2) and t3<λ/(4×n3) respectively when the refractive indices of the AlN film 41, the Al$_2$O$_3$ film 42 and the AlN film 43 are n1 (=about 2.15), n2 (=about 1.68) and n3 (=about 2.15) respectively.

In other words, the AlN film 41 is preferably so formed that the thickness t1 thereof is t1<about 47 nm in the semiconductor element layer 20 having the lasing wavelength λ of about 405 nm, according to the first embodiment. Further, the AlN layer 43 is preferably so formed that the thickness t3 thereof is t3<about 47 nm. The nitride films (AlN films 41 and 43) are more preferably formed to have thicknesses in the range of about 1 nm to about 20 nm. The Al$_2$O$_3$ film 42 is preferably so formed that the thickness t2 thereof is t2<about 60 nm, and more preferably has a thickness in the range of about 1 nm to about 20 nm, in particular.

As shown in FIG. 1, a second alteration preventing layer 60 which is such a dielectric multilayer film that an AlN film 61 having a thickness of about 10 nm in contact with the light reflecting surface 2 and an Al$_2$O$_3$ film 62 having a thickness of about 10 nm in contact with the AlN film 61 are stacked successively from the side closer to the light reflecting surface 2 is formed on the light reflecting surface 2 of the nitride-based semiconductor laser device 1000. An SiO$_2$ film 63 having a thickness of about 140 nm in contact with the Al$_2$O$_3$ film 62 is formed on the second alteration preventing layer 60. A multilayer reflecting film 64 which is such a dielectric multilayer film having a thickness of about 720 nm that six SiO$_2$ films each having a thickness of about 70 nm as a low refractive index film in contact with the SiO$_2$ film 63 and six ZrO$_2$ films each having a thickness of about 50 nm as a high refractive index film are alternately stacked is formed on the SiO$_2$ film 63. The multilayer reflecting film 64 has a function of controlling a reflectance, and the light reflecting surface 2 is set to have a high reflectance of about 98% for the laser beam due to the multilayer reflecting film 64.

According to the first embodiment, the thickness t5 (=about 10 nm) of the AlN film 61, the thickness t6 (=about 10 nm) of the Al$_2$O$_3$ film 62 and the thickness t8 (=about 140 nm) of the SiO$_2$ film 63 have the relations of t5<λ/(4×n5), t6<λ/(4×n6) and t8≈λ/(2×n8) respectively when the refractive indices of the AlN film 61, the Al$_2$O$_2$ film 62 and the SiO$_2$ film 63 are n5 (=about 2.15), n6 (=about 1.68) and n8 (=about 1.48) respectively.

In the semiconductor element layer 20 of the nitride-based semiconductor laser device 1000, an n-type layer 21, having a thickness of about 100 nm, made of n-type GaN doped with Si having a doping quantity of about 5×10$^{18}$ cm$^{-3}$ is formed on the upper surface of the substrate 10, as shown in FIG. 2. Further, an n-type cladding layer 22, having a thickness of about 400 nm, made of n-type Al$_{0.07}$Ga$_{0.93}$N doped with Si having a doping quantity of about 5×10$^{18}$ cm$^{-3}$ and a carrier concentration of about 5×10$^{18}$ cm$^{-3}$ is formed on the n-type layer 21.

An n-type carrier blocking layer 23, having a thickness of about 5 nm, made of n-type Al$_{0.16}$Ga$_{0.84}$N doped with Si having a doping quantity of about 5×10$^{18}$ cm$^{-3}$ and a carrier concentration of about 5×10$^{18}$ cm$^{-3}$ is formed on the n-type cladding layer 22. Further, an n-type light guide layer 24, having a thickness of about 100 nm, made of n-type GaN doped with Si having a doping quantity of about 5×10$^{18}$ cm$^{-3}$ and a carrier concentration of about 5×10$^{18}$ cm$^{-3}$ is formed on the n-type carrier blocking layer 23. In addition, an active layer 25 is formed on the n-type light guide layer 24. This active layer 25 has an MQW structure in which four barrier layers made of undoped In$_{0.02}$Ga$_{0.98}$N each having a thickness of about 20 nm and three well layers made of undoped In$_{0.1}$Ga$_{0.9}$N each having a thickness of about 3 nm are alternately stacked.

As shown in FIG. 2, a p-type light guide layer 26, having a thickness of about 100 nm, made of p-type GaN doped with Mg having a doping quantity of about 4×10$^{19}$ cm$^{-3}$ and a carrier concentration of about 5×10$^{17}$ cm$^{-3}$ is formed on the active layer 25. A p-type cap layer 27, having a thickness of about 20 nm, made of p-type Al$_{0.16}$Ga$_{0.84}$N doped with Mg having a doping quantity of about 4×10$^{19}$ cm$^{-3}$ and a carrier concentration of about 5×10$^{17}$ cm$^{-3}$ is formed on the p-type light guide layer 26.

A p-type cladding layer 28, having a projecting portion 28a and a planar portion 28b other than the projecting portion 28a, made of p-type Al$_{0.07}$Ga$_{0.93}$N doped with Mg having a doping quantity of about 4×10$^{19}$ cm$^{-3}$ and a carrier concentration of about 5×10$^{17}$ cm$^{-3}$ is formed on the p-type cap layer 27. The planar portion 28b of this p-type cladding layer 28 has a thickness of about 80 nm on the right and left sides of the projecting portion 28a. The p-type cladding layer 28 has a height of about 320 nm from the upper surface of the planar portion 28b to the upper surface of the projecting portion 28a, while the projecting portion 28a has a width of about 1.5 μm.

A p-type contact layer 29, having a thickness of about 10 nm, made of p-type In$_{0.02}$Ga$_{0.98}$N doped with Mg having a doping quantity of about 4×10$^{19}$ cm$^{-3}$ and a carrier concentration of about 5×10$^{17}$ cm$^{-3}$ is formed on the projecting portion 28a of the p-type cladding layer 28. A ridge portion 30 having one side surface 30a and another side surface 30b positioned on the side opposite to the side surface 30a is constituted of this p-type contact layer 29 and the projecting portion 28a of the p-type cladding layer 28. The ridge portion 30 has a width of about 1.5 μm on the lower portion, and is formed in a shape extending in a [1-100] direction (direction A in FIG. 1 which is the outgoing direction of the laser beam).

A waveguide extending in the [1-100] direction (direction A in FIG. 1) is formed on a portion including the active layer 25 positioned under the ridge portion 30, and a cavity is constituted of this waveguide, the light emitting surface 1 and the light reflecting surface 2. The n-type layer 21, the n-type cladding layer 22, the n-type carrier blocking layer 23, the n-type light guide layer 24, the active layer 25, the p-type light guide layer 26, the p-type cap layer 27, the p-type cladding layer 28 and the p-type contact layer 29 are examples of the "semiconductor element layer" in the present invention respectively. The active layer 25 is an example of the "light emitting layer" in the present invention.

As shown in FIG. 2, a p-side ohmic electrode 31 in which a Pt layer having a thickness of about 5 nm, a Pd layer having a thickness of about 100 nm and an Au layer having a thickness of about 150 nm are formed in this order from the lower layer side toward the upper layer side is formed on the p-type contact layer 29 constituting the ridge portion 30. A current blocking layer 32 consisting of an SiO$_2$ film (insulating film) having a thickness of about 250 nm is formed on a region other than the upper surface of the p-side ohmic electrode 31. Further, a p-side pad electrode 33 in which a Ti layer having a thickness of about 100 nm, a Pd layer having a thickness of about 100 nm and an Au layer having a thickness of about 3 μm are formed in this order from the lower layer side toward the upper layer side is formed on a prescribed region of the current blocking layer 32, to be in contact with the upper surface of the p-side ohmic electrode 31.

As shown in FIG. 2, an n-side electrode 34 is formed on the lower surface of the n-type GaN substrate 10. This n-side electrode 34 is constituted of an Al layer having a thickness of about 10 nm, a Pt layer having a thickness of about 20 m and an Au layer having a thickness of about 300 nm, which are stacked successively from the side closer to the lower surface of the n-type GaN substrate 10.

The manufacturing process for the nitride-based semiconductor laser device 1000 according to the first embodiment is now described with reference to FIG. 1 and FIG. 2.

First, the n-type layer 21 having the thickness of about 100 nm, the n-type cladding layer 22 having the thickness of about 400 nm, the n-type carrier blocking layer 23 having the thickness of about 5 nm, the n-type light guide layer 24 having the thickness of about 100 nm and the active layer 25 having a total thickness of about 90 nm are successively formed on the substrate 10 by metal organic vapor phase epitaxy (MOVPE), as shown in FIG. 2. Further, the p-type light guide layer 26 having the thickness of about 100 nm, the p-type cap layer 27 having the thickness of about 20 nm, the p-type cladding layer 28 having the thickness of about 400 nm and the p-type contact layer 29 having the thickness of about 10 nm are successively formed on the active layer 25. Thereafter p-type annealing treatment and formation of the ridge portion 30 by etching are performed, and the p-side ohmic electrode 31, the current blocking layer 32 and the p-side pad electrode 33 are thereafter formed by vacuum evaporation respectively. Further, the n-side electrode 34 is formed on the lower surface of the substrate 10 by vacuum evaporation.

A method of forming the cavity facets constituting the nitride-based semiconductor laser device 1000 (see FIG. 1) and the facet coating films is now described. First, scribed lines are formed on prescribed portions by laser scribing or mechanical scribing, in a direction orthogonal to the extensional direction (direction A in FIG. 1) of the ridge portion 30. These scribed lines are formed on portions excluding the ridge portion 30 in the form of broken lines.

According to the first embodiment, the substrate 10 provided with the aforementioned semiconductor laser structure is cleaved along the scribed lines, to form a structure separated in a bar state. Thereafter the substrate of the bar state provided with cleavage planes is introduced into an electron cyclotron resonance (ECR) sputtering film forming apparatus.

Further, ECR plasma is applied to the light emitting surface 1 (see FIG. 1) consisting of a cleavage plane, thereby cleaning the light emitting surface 1. The ECR plasma is generated in an $N_2$ gas atmosphere. At this time, the light emitting surface 1 (see FIG. 1) is slightly etched. In this case, no RF power is applied to the sputtering target. Thereafter the first alteration preventing layer 40 and the $Al_2O_3$ film 51 (see FIG. 1) are successively formed on the light emitting surface 1 by ECR sputtering.

Similarly to the aforementioned step of cleaning the light emitting surface 1, ECR plasma is applied to the light reflecting surface 2 (see FIG. 1) consisting of a cleavage plane, thereby cleaning the light reflecting surface 2. At this time, the light reflecting surface 2 is slightly etched. In this case, no RF power is applied to the sputtering target. Thereafter the second alteration preventing layer 60, the $SiO_2$ film 63 and the multilayer reflecting film 64 (see FIG. 1) are formed on the light reflecting surface 2 by ECR sputtering.

Thereafter the nitride-based semiconductor laser device 1000 worked into a chip is formed by splitting the substrate 10 in the bar state in a direction parallel to the extensional direction (direction A in FIG. 1) of the ridge portion 30.

Thus, according to the first embodiment, the steps of performing cleaning on the light emitting surface 1 and the light reflecting surface 2 after cleavage are so provided that the nitride-based semiconductor laser device 1000 suppressed from deterioration in the vicinity of end faces of the waveguide and formation of COD can be easily formed. The nitride-based semiconductor laser device 1000 according to the first embodiment is formed in this manner.

According to the first embodiment, as hereinabove described, the first alteration preventing layer 40 in which the AlN film 41, the $Al_2O_3$ film 42 and the AlN film 43 are stacked successively from the side closer to the light emitting surface 1 is provided on the light emitting surface 1. Thus, oxygen present in the $Al_2O_3$ film 51 and in the atmosphere is hardly incorporated into the first alteration preventing layer 40 due to the AlN film 43 arranged on the outer side, whereby desorption of oxygen on the interface between the $Al_2O_3$ film 42 and the AlN film 41, substitution reaction between oxygen and nitrogen and the like are suppressed. In other words, the interface between the $Al_2O_3$ film 42 and the AlN film 41 is suppressed from alteration and deterioration. Therefore, heat generation in the vicinity of the light emitting surface 1 and the first alteration preventing layer 40 is suppressed also when the emitted laser beam has higher output, whereby breakage of the cavity facet (light emitting surface 1) on the light emitting side is suppressed. Consequently, the reliability of the nitride-based semiconductor laser device 1000 can be improved. The aforementioned effects are particularly effective with respect to a semiconductor laser device emitting a laser beam having high energy with a short lasing wavelength of not more than about 525 nm.

Even if alteration takes place on the interface between the $Al_2O_3$ film 42 and the AlN film 41 in the case of the aforementioned structure, an alteration region spreading in the $Al_2O_3$ film 42 can be kept within the $Al_2O_3$ film 42 due to the AlN film 43, whereby extension of the alteration is suppressed. Thus, alteration of the first alteration preventing film 40 can be suppressed to the minimum.

Further, the reflectance for the laser beam emitted from the light emitting surface 1 can be easily controlled by adjusting the thickness of the $Al_2O_3$ film 51 formed on the first alteration preventing layer 40, i.e., on the surface of the first alteration preventing layer 40 positioned on the side opposite to the light emitting surface 1. Thus, the reliability of the nitride-based semiconductor laser device 1000 corresponding to higher output can be improved.

Further, the thickness t1 of the AlN film 41 constituting the first alteration preventing layer 40, the thickness t2 of the $Al_2O_3$ film 42 and the thickness t3 of the AlN film 43 are set to be $t1<\lambda/(4\times n1)$, $t2<\lambda/(4\times n2)$ and $t3<\lambda/(4\times n3)$ respectively, whereby the thicknesses of the respective films constituting the first alteration preventing layer 40 are smaller than $\lambda/(4\times n)$. Thus, the laser beam emitted from the light emitting surface 1 is transmitted without being influenced by the thicknesses of the respective films constituting the first alteration preventing layer 40 and reaches the $Al_2O_3$ film 51. Consequently, the reflectance controlling function of the $Al_2O_3$ film 51 set to have the desired reflectance (about 8%) can be easily suppressed from being influenced by the first alteration preventing layer 40. Further, the thicknesses of the respective films constituting the first alteration preventing layer 40 are small, whereby film separation (peeling) or the like resulting from stress after film formation can also be suppressed.

According to the first embodiment, the AlN film 41 of the first alteration preventing layer 40 is in contact with the semiconductor element layer 20. Thus, the AlN film 41 is in contact with the light emitting surface 1, whereby oxygen in the $Al_2O_3$ film 42 can be easily suppressed from being incorporated into the semiconductor element layer 20, due to the AlN film 41.

According to the first embodiment, the AlN films 41 and 43 and the $Al_2O_3$ film 42 contain the same Al element. Thus, the AlN film 41 and the $Al_2O_3$ film 42 in contact with each other and the AlN film 43 and the $Al_2O_3$ film 42 in contact with each other are materials containing the same type of metallic element (Al element) respectively, whereby adhesiveness at the time of contact can be improved. Consequently, film separation (peeling) of the AlN film 41 and the AlN film 43 can be suppressed.

According to the first embodiment, the AlN film 41 and the AlN film 43 contain Al respectively. Thus, the insulating properties of the AlN film 41 and the AlN film 43 can be improved since nitrides containing Al have excellent insulating properties. Further, oxygen can be effectively suppressed from being incorporated into the first alteration preventing layer 40 and the semiconductor element layer 20, due to the nitride films containing Al.

According to the first embodiment, the $Al_2O_3$ film 42 contains Al. Thus, the insulating property of the $Al_2O_3$ film 42 can be improved since an oxide containing Al has an excellent insulating property. Further, the $Al_2O_3$ film 42 containing Al and the AlN films 41 and 43 holding the $Al_2O_3$ film 42 therebetween from both sides can be easily brought into contact with each other due to the same type of metallic element (Al element), whereby adhesiveness between the respective films can be improved.

According to the first embodiment, the semiconductor element layer 20 including the active layer 25 is made of nitride-based semiconductors. Thus, breakage of the cavity facet (light emitting surface 1) on the light emitting side resulting from heat generation in emission of the laser beam can be particularly effectively suppressed in the nitride-based semiconductor laser device 1000 having the short lasing wavelength in the band of about 405 nm and emitting a high-energy laser beam.

According to the first embodiment, the thickness t5 of the AlN film 61 constituting the second alteration preventing layer 60 and the thickness t6 of the Al$_2$O$_3$ film 62 are set to be t5<λ/(4×n5) and t6<λ/(4×n6) respectively, whereby the thicknesses of the respective films constituting the second alteration preventing layer 60 are smaller than λ/(4×n). Thus, the laser beam emitted from the light reflecting surface 2 is transmitted without being influenced by the thicknesses of the respective films constituting the second alteration preventing layer 60. Further, the thickness t8 of the SiO$_2$ film 63 is set to be t8≈λ/(2×n8), whereby the laser beam is substantially not reflected on the SiO$_2$ film 63 either. Consequently, the reflectance controlling function of the multilayer reflecting film 64 set to have the desired reflectance (about 98%) can be easily suppressed from being influenced by the second alteration preventing layer 60.

Further, the thicknesses of the respective films constituting the second alteration preventing layer 60 are small, whereby film separation (peeling) or the like resulting from stress after film formation can also be suppressed.

First Modification of First Embodiment

Referring to FIG. 3, an SiO$_2$ film 52 having a thickness of about 95 nm is formed to be in contact with a first alteration preventing layer 40 in this first modification of the first embodiment, dissimilarly to the aforementioned first embodiment. The SiO$_2$ film 52 is an example of the "second oxide film" or the "second insulating film" in the present invention.

The remaining structure of and a manufacturing process for a nitride-based semiconductor laser device 1005 according to the first modification of the first embodiment are similar to those of the aforementioned first embodiment.

According to the first modification of the first embodiment, as hereinabove described, the reflectance for a laser beam emitted from a light emitting surface 1 can be easily controlled by adjusting the thickness of the SiO$_2$ film 52 formed on the first alteration preventing layer 40, i.e., on the surface of the first alteration preventing layer 40 positioned on a side opposite to the light emitting surface 1. Thus, the reliability of the nitride-based semiconductor laser device 1005 corresponding to higher output can be improved, similarly to the aforementioned first embodiment. The remaining effects of this first modification are similar to those of the aforementioned first embodiment.

Second Embodiment

Referring to FIG. 4, a case of employing an AlO$_X$N$_Y$ film 44 which is an oxynitride film in place of the Al$_2$O$_3$ film 42 employed in the aforementioned first embodiment while employing an AlO$_X$N$_Y$ film 45 which is an oxynitride film between a first alteration preventing layer 40 and an Al$_2$O$_3$ film 51 is described in this second embodiment. The AlO$_X$N$_Y$ film 44 is an example of the "first oxynitride film" or the "first intermediate film" in the present invention. The AlO$_X$N$_Y$ film 45 is an example of the "third oxynitride film" or the "second intermediate film" in the present invention. In the following description, the AlO$_X$N$_Y$ film 44 and the AlO$_X$N$_Y$ film 45 are referred to as an AlON film 44 and an AlON film 45 respectively.

According to the second embodiment, a first alteration preventing layer 240 which is such a dielectric multilayer film that an AlN film 41 having a thickness of about 10 nm in contact with a light emitting surface 1, the AlON film 44 having a thickness of about 10 nm in contact with the AlN film 41 and an AlN film 43 having a thickness of about 10 nm in contact with the AlON film 44 are stacked successively from the side closer to the light emitting surface 1 is formed on the light emitting surface 1 of a nitride-based semiconductor laser device 2000, as shown in FIG. 4. The AlON film 45 having a thickness of about 10 nm and the Al$_2$O$_3$ film 51 having a thickness of about 70 nm are formed on the first alteration preventing layer 240, to be in contact with the first alteration preventing layer 240. In other words, two nitride films and two oxynitride films are alternately stacked on the light emitting surface 1 successively from the side closer to the light emitting surface 1 according to the second embodiment. The first alteration preventing layer 240 is an example of the "first insulating film" in the present invention.

According to the second embodiment, the thickness t2 (=about 10 nm) of the AlON film 44 and the thickness t4 (=about 10 nm) of the AlON film 45 are set to have the relations of t2<λ/(4×n2) and t4<λ/(4×n4) respectively when the refractive indices of the AlON films 44 and 45 are n2 and n4 (=values in the range of about 1.68 to about 2.15 (since decided due to the mixing ratios between Al$_2$O$_3$ and AlN)) respectively.

In other words, the AlON films 44 and 45 are preferably so formed that the thicknesses t2 and t4 thereof are in the range of t2<about 47 nm to about 60 nm and in the range of t4<about 47 nm to about 60 nm respectively in a semiconductor element layer 20 having a lasing wavelength λ of about 405 nm, according to the second embodiment. The refractive index of AlON is decided in the range of about 1.68 to about 2.15 due to the mixing ratios between Al$_2$O$_3$ and AlN, and hence the aforementioned ranges are present for the thicknesses t2 and t4 of the AlON films 44 and 45. The oxynitride films (AlON films 44 and 45) more preferably have thicknesses in the range of about 1 nm to about 20 nm.

The remaining structure of and a manufacturing process for the nitride-based semiconductor laser device 2000 according to the second embodiment are similar to those of the aforementioned first embodiment.

According to the second embodiment, as hereinabove described, the first alteration preventing layer 240 in which the AlN film 41, the AlON film 44 and the AlN film 43 are successively formed from the side closer to the light emitting surface 1 is provided on the light emitting surface 1. Thus, oxygen present in the AlON film 44 and in the atmosphere is hardly incorporated into the first alteration preventing layer 240 due to the AlN film 43 arranged on the outer side, whereby desorption of oxygen on the interface between the AlON film 44 and the AlN film 41, substitution reaction between oxygen and nitrogen and the like are suppressed. In other words, the interface between the AlON film 44 and the AlN film 41 is suppressed from alteration and deterioration. In particular, an oxynitride film such as the AlON film 44 has a smaller content of oxygen atoms than an oxide film such as the Al$_2$O$_3$ film, and hence the aforementioned reaction conceivably gets slighter. Therefore, heat generation in the vicinity of the light emitting surface 1 and the first alteration preventing layer 240 is suppressed even if an emitted laser beam has higher output, whereby breakage of a cavity facet (light emitting surface 1) is further suppressed. Consequently, the reliability of the nitride-based semiconductor laser device 2000 can be further improved.

Even if alteration takes place on the interface between the AlON film 44 and the AlN film 41, an alteration region spreading in the AlON film 44 can be kept within the AlON film 44 due to the AlN film 43, whereby extension of the alteration is suppressed. Thus, alteration of the first alteration preventing layer 240 can be suppressed to the minimum.

Further, the thickness t1 of the AlN film 41 constituting the first alteration preventing layer 240, the thickness t2 of the AlON film 44 and the thickness t3 of the AlN film 43 are set to be t1<λ/(4×n1), t2<λ/(4×n2) and t3<λ/(4×n3) respectively, whereby the thicknesses of the respective films constituting the first alteration preventing layer 240 are smaller than λ/(4×n). Thus, the laser beam emitted from the light emitting surface 1 is transmitted without being influenced by the thicknesses of the respective films constituting the first alteration preventing layer 240 and reaches the Al$_2$O$_3$ film 51. Consequently, a reflectance controlling function of the Al$_2$O$_3$ film 51 set to have a desired reflectance (about 8%) can be easily suppressed from being influenced by the first alteration preventing layer 240. Further, the thicknesses of the respective films constituting the first alteration preventing layer 240 are small, whereby film separation (peeling) or the like resulting from stress after film formation can also be suppressed.

According to the second embodiment, the AlON film 45 which is an oxynitride film is further formed between the first alteration preventing layer 240 and the Al$_2$O$_3$ film 51. Thus, a region consisting of the AlN film 41 and the AlON film 44 and a region consisting of the AlN film 43 and the AlON film 45 are formed on the light emitting surface 1 successively from the side closer to the light emitting surface 1 and multilayered, whereby breakage of the cavity facet (light emitting surface 1) on a light emitting side can be further suppressed.

According to the second embodiment, the thickness t4 of the AlON film 45 is also set to be t4<λ/(4×n4). Thus, the laser beam emitted from the light emitting surface 1 is transmitted without being influenced by the thickness of the AlON film 45 either and reaches the Al$_2$O$_3$ film 51. Consequently, the reflectance controlling function of the Al$_2$O$_3$ film 51 controlling a reflectance can be easily suppressed from being influenced by the first alteration preventing layer 240.

According to the second embodiment, the AlON film 44 contains Al. Thus, the insulating property of the AlON film 44 can be improved since an oxynitride containing Al has an excellent insulating property. Further, the AlON film 44 and the AlN films 41 and 43 holding the AlON film 44 therebetween from both sides can be easily brought into contact with each other due to the same type of metallic element (Al element), whereby adhesiveness between the respective films can be improved. The remaining effects of the second embodiment are similar to those of the aforementioned first embodiment.

Third Embodiment

Figure 5:
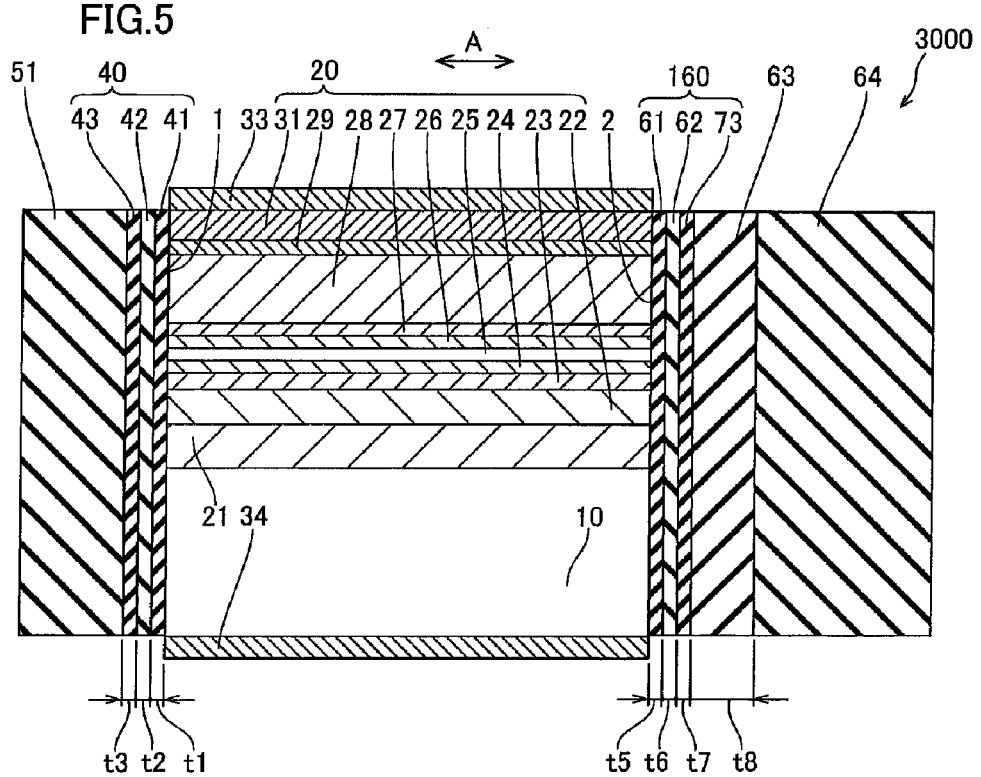
FIG. 5 A sectional view of a semiconductor laser device on a surface along a cavity direction, for illustrating the structure of a semiconductor laser device according to a third embodiment of the present invention.

Referring to FIG. 5, a case where a second alteration preventing layer 160 which is such a dielectric multilayer film that nitride films and an oxide film are multilayered is formed on the side of a light reflecting surface 2 dissimilarly to the aforementioned first embodiment is described in this third embodiment. The second alteration preventing layer 160 is an example of the "third insulating film" in the present invention.

According to the third embodiment, the second alteration preventing layer 160 which is such a dielectric multilayer film that an AlN film 61 having a thickness of about 10 nm in contact with the light reflecting surface 2, an Al$_2$O$_3$ film 62 having a thickness of about 10 nm in contact with the AlN film 61 and an AlN film 73 having a thickness of about 10 nm in contact with the Al$_2$O$_3$ film 62 are stacked successively from the side closer to the light reflecting surface 2 is formed on the light reflecting surface 2 of a nitride-based semiconductor laser device 3000, as shown in FIG. 5. The AlN film 61 is an example of the "third nitride film" in the present invention, and the Al$_2$O$_3$ film 62 is an example of the "fourth oxide film" or the "third intermediate film" in the present invention, and the AlN film 73 is an example of the "fourth nitride film" in the present invention. According to the third embodiment, the AlN film 61, the Al$_2$O$_3$ film 62 and the AlN film 73 have functions of suppressing the second alteration preventing layer 160 itself and the light reflecting surface 2 from altering following reflection of a laser beam.

An SiO$_2$ film 63 having a thickness of about 140 nm is formed on the second alteration preventing layer 160, i.e., on the surface of the second alteration preventing layer 160 positioned on a side opposite to the light reflecting surface 2, to be in contact with the AlN film 73. Further, a multilayer reflecting film 64 which is such a dielectric multilayer film having a thickness of about 720 nm that six SiO$_2$ films each having a thickness of about 70 nm as a low refractive index film in contact with the SiO$_2$ film 63 and six ZrO$_2$ films each having a thickness of about 50 nm as a high refractive index film are alternately stacked is formed on the SiO$_2$ film 63.

According to the third embodiment, the thickness t5 (=about 10 nm) of the AlN film 61, the thickness t6 (=about 10 nm) of the Al$_2$O$_3$ film 62 and the thickness t7 (=about 10 nm) of the AlN film 73 are set to have the relations of t5<λ/(4×n5), t6<λ/(4×n6) and t7<λ/(4×n7) respectively when the refractive indices of the AlN film 61, the Al$_2$O$_3$ film 62 and the AlN film 73 are n5 (=about 2.15), n6 (=about 1.68) and n7 (=about 2.15) respectively.

In other words, the AlN film 61 is preferably so formed that the thickness t5 thereof is t5<about 47 nm in a semiconductor element layer 20 having a lasing wavelength λ of about 405 nm, according to the third embodiment. Further, the AlN film 73 is preferably so formed that the thickness t6 thereof is t6<about 47 nm. The nitride films (AlN films 61 and 73) are more preferably formed to have thicknesses in the range of about 1 nm to about 20 nm. The Al$_2$O$_3$ film 62 is preferably so formed that the thickness t7 thereof is t7<about 60 nm, and more preferably has a thickness in the range of about 1 nm to about 20 nm, in particular.

The remaining structure of and a manufacturing process for the nitride-based semiconductor laser device 3000 according to the third embodiment are similar to those of the aforementioned first embodiment.

According to the third embodiment, as hereinabove described, the second alteration preventing layer 160 in which the AlN film 61, the Al$_2$O$_3$ film 62 and the AlN film 73 are formed successively from the side closer to the light reflecting surface 2 is provided on the light reflecting surface 2. Thus, oxygen present in the multilayer reflecting film 64 made of oxides and in the atmosphere is hardly incorporated into the second alteration preventing layer 160 due to the AlN film 73 arranged on the outer side, whereby the interface between the Al$_2$O$_3$ film 62 and the AlN film 61 is suppressed from alteration and deterioration. Therefore, heat generation in the light reflecting surface 2 and the second alteration preventing layer 160 is suppressed even if an emitted laser beam has higher output, whereby breakage of a cavity facet (light reflecting surface 2) on a light reflecting side is suppressed. Consequently, the reliability of the nitride-based semiconductor laser device 3000 can be further improved.

Even if alteration takes place on the interface between the Al$_2$O$_3$ film 62 and the AlN film 61, an alteration region spreading in the Al$_2$O$_3$ film 62 can be kept within Al$_2$O$_3$ film 62 due to the AlN film 73, whereby extension of the alteration can be suppressed. Thus, alteration of the second alteration preventing layer 160 can be suppressed to the minimum.

The thickness t5 of the AlN film 61 constituting the second alteration preventing layer 160, the thickness t6 of the Al$_2$O$_3$ film 62 and the thickness t7 of the AlN film 73 are set to be t5<λ/(4×n5), t6<λ/(4×n6) and t7<λ/(4×n7) respectively, whereby the thicknesses of the respective films constituting the second alteration preventing layer 160 are smaller than $\lambda/(4\times n)$. Thus, the laser beam once emitted from the light reflecting surface 2 is transmitted without being influenced by the thicknesses of the respective films constituting the second alteration preventing layer 160 and reaches the multilayer reflecting film 64. Thus, a reflectance controlling function of the multilayer reflecting film 64 set to have a desired reflectance (about 98%) can be easily suppressed from being influenced by the second alteration preventing layer 160. Further, the thicknesses of the respective films constituting the second alteration preventing layer 160 are small, whereby film separation (peeling) or the like resulting from stress after film formation can also be suppressed.

According to the third embodiment, the AlN film 61 of the second alteration preventing layer 160 is in contact with the semiconductor element layer 20. Thus, the AlN film 61 is in contact with the light reflecting surface 2, whereby oxygen in the $Al_2O_3$ film 62 can be easily suppressed from being incorporated into the semiconductor element layer 20, due to the AlN film 61.

According to the third embodiment, the AlN films 61 and 73 and the $Al_2O_3$ film 62 contain the same Al element. Thus, the AlN film 61 and the $Al_2O_3$ film 62 in contact with each other and the AlN film 73 and the $Al_2O_3$ film 62 in contact with each other are materials containing the same type of metallic element (Al element) respectively, whereby adhesiveness at the time of contact can be improved. Consequently, film separation (peeling) of the AlN film 61 and the AlN film 73 can be suppressed.

According to the third embodiment, the AlN film 61 and the AlN film 73 contain Al respectively. Thus, the insulating properties of the AlN film 61 and the AlN film 73 can be improved since nitrides containing Al have excellent insulating properties. Further, oxygen can be effectively suppressed from being incorporated into the second alteration preventing layer 160 and the semiconductor element layer 20, due to the nitride films containing Al.

According to the third embodiment, the $Al_2O_3$ film 62 contains Al. Thus, the insulating property of the $Al_2O_3$ film 62 can be improved since an oxide containing Al has an excellent insulating property. Further, the $Al_2O_3$ film 62 and the AlN films 61 and 73 holding the $Al_2O_3$ film 62 therebetween from both sides contain the common element (Al), whereby adhesiveness between the respective films can be improved.

According to the third embodiment, the multilayer reflecting film 64 is provided on the second alteration preventing layer 160 through the $SiO_2$ film 63 in contact with the AlN film 73. Thus, the reflectance for the laser beam emitted from the second alteration preventing layer 160 in the light reflecting surface 2 can be controlled by adjusting the thickness of the multilayer reflecting film 64. The remaining effects of the third embodiment are similar to those of the aforementioned first embodiment.

Fourth Embodiment

Figure 6:
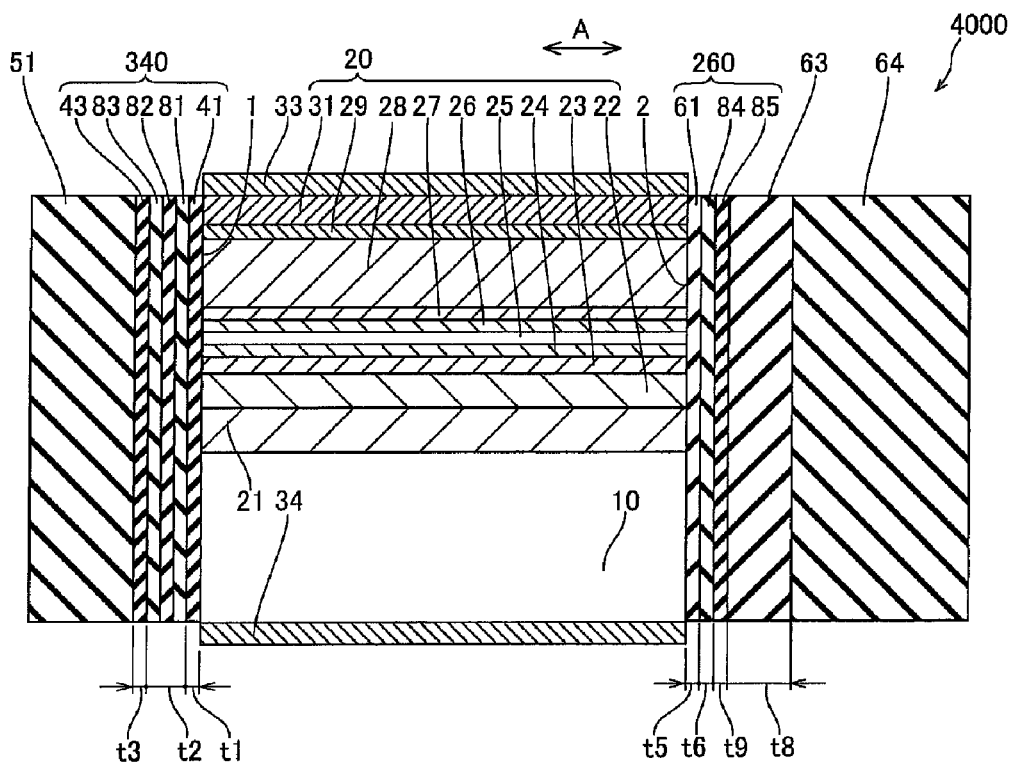
FIG. 6 A sectional view of a semiconductor laser device on a surface along a cavity direction, for illustrating the structure of a semiconductor laser device according to a fourth embodiment of the present invention.

Referring to FIG. 6, a case where a first alteration preventing layer 340 constituting a nitride-based semiconductor laser device 4000 is formed by two nitride films as well as an oxide film and an oxynitride film held between these two nitride films and a second alteration preventing layer 260 has a structure in which a nitride film, an oxynitride film and an oxide film are successively stacked dissimilarly to the aforementioned embodiment is described in this fourth embodiment.

According to the fourth embodiment, the first alteration preventing layer 340 which is such a dielectric multilayer film that an AlN film 41 having a thickness of about 10 nm in contact with a light emitting surface 1, an AlON film 81 having a thickness of about 5 nm in contact with the AlN film 41, an $Al_2O_3$ film 82 having a thickness of about 2.5 nm in contact with the AlON film 81, an AlON film 83 having a thickness of about 2.5 nm in contact with the $Al_2O_3$ film 82 and an AlN film 43 having a thickness of about 10 nm in contact with the AlON film 83 are stacked successively from the side closer to the light emitting surface 1 is formed on the light emitting surface 1 of the nitride-based semiconductor laser device 4000, as shown in FIG. 6. An $Al_2O_3$ film 51 having a thickness of about 73 nm is formed on the first alteration preventing layer 340, to be in contact with the first alteration preventing layer 340. The AlON film 81, the $Al_2O_3$ film 82 and the AlON film 83 are examples of the "first intermediate film" in the present invention, and are examples of the "first oxynitride film", the "first oxide film" and the "first oxynitride film" respectively. The light emitting surface 1 is set to have a reflectance of about 8% for a laser beam due to the $Al_2O_3$ film 51.

According to the fourth embodiment, the total thickness t2 (=about 10 nm) possessed by the AlON film 81, the $Al_2O_3$ film 82 and the AlON film 83 is set to have the relation of $t2<\lambda/(4\times n2)$ when the average refractive index possessed by the AlON film 81, the $Al_2O_3$ film 82 and the AlON film 83 is n2. The average refractive index $2n$ of the multilayer film consisting of the aforementioned three layers (AlON film 81, $Al_2O_3$ film 82 and AlON film 83) is decided in the range of about 1.68 to about 2.15 due to the mixing ratio between $Al_2O_3$ and AlN, and hence a semiconductor element layer 20 having a lasing wavelength $\lambda$ of about 405 nm is preferably so formed that the total thickness t2 thereof is in the range of t2<about 47 nm (AlN is about 100%) to about 60 nm ($Al_2O_3$ is about 100%), and more preferably formed to have a thickness in the range of about 1 nm to about 20 nm.

As shown in FIG. 6, the second alteration preventing layer 260 which is such a dielectric multilayer film that an AlN film 61 having a thickness of about 10 nm in contact with a light reflecting surface 2, an AlON film 84 having a thickness of about 5 nm in contact with the AlN film 61 and an $Al_2O_3$ film 85 having a thickness of about 5 nm in contact with the AlON film 84 are stacked successively from the side closer to the light reflecting surface 2 is formed on the light reflecting surface 2 of the nitride-based semiconductor laser device 4000. An $SiO_2$ film 63 having a thickness of about 140 nm in contact with the $Al_2O_3$ film 85 is formed on the second alteration preventing layer 260. A multilayer reflecting film 64 which is such a dielectric multilayer film having a thickness of about 720 nm that six $SiO_2$ films each having a thickness of about 70 nm as a low refractive index film in contact with the $SiO_2$ film 63 and six $ZrO_2$ films each having a thickness of about 50 nm as a high refractive index film are alternately stacked is formed on the $SiO_2$ film 63. The light reflecting surface 2 is set to have a high reflectance of about 98% for the laser beam due to the multilayer reflecting film 64.

According to the fourth embodiment, the thickness t5 (=about 10 nm) of the AlN film 61, the thickness t6 (=about 5 nm) of the AlON film 84 and the thickness t9 (=about 5 nm) of the $Al_2O_3$ film 85 are set to have the relations of $t5<\lambda/(4\times n5)$, $t6<\lambda/(4\times n6)$ and $t9<\lambda/(4\times n9)$ respectively when the refractive indices of the AlN film 61, the AlON film 84 and the $Al_2O_3$ film 85 are n5 (=about 2.15), n6 (=about 1.68 to about 2.15) and n9 (=about 1.68) respectively.

The remaining structure of and a manufacturing process for the nitride-based semiconductor laser device 4000 according to the fourth embodiment are similar to those of the aforementioned first embodiment.

According to the fourth embodiment, as hereinabove described, the AlON film 81, the $Al_2O_3$ film 82 and the AlON film 83 are formed between the AlN film 41 and the AlN film 43. Thus, oxygen present in the $Al_2O_3$ film 51 and in the atmosphere is further hardly incorporated into the first alteration preventing layer 340, whereby the interface between the AlON film 81 and the AlN film 41 can be further suppressed from alteration and deterioration.

According to the fourth embodiment, the AlON film 81 and the AlON film 83 are formed to hold the $Al_2O_3$ film 82 therebetween in the stacking direction, between the AlN film 41 and the AlN film 43. Thus, the first alteration preventing layer 340 is stacked in the order of a nitride film (AlN film 41), an oxynitride film (AlON film 81), an oxide film ($Al_2O_3$ film 82), an oxynitride film (AlON film 83) and a nitride film (AlN film 43), whereby it follows that the composition in the first alteration preventing layer 340 gradually changes. Consequently, adhesiveness between the respective films in the first alteration preventing layer 340 can be further improved, whereby the strength of the first alteration preventing layer 340 consisting of a plurality of thin films can be maintained.

According to the fourth embodiment, the thickness t5 of the AlN film 61 constituting the second alteration preventing layer 260, the thickness t6 of the AlON film 84 and the thickness t9 of the $Al_2O_3$ film 85 are set to be $t5<\lambda/(4\times n5)$, $t6<\lambda/(4\times n6)$ and $t9<2/(4\times n9)$ respectively, whereby the thicknesses of the respective films constituting the second alteration preventing layer 260 are smaller than $\lambda/(4\times n)$. Thus, the laser beam emitted from the light reflecting surface 2 is transmitted without being influenced by the thicknesses of the respective films constituting the second alteration preventing layer 260. The remaining effects of the fourth embodiment are similar to those of the aforementioned first embodiment.

Fifth Embodiment

The structure of a nitride-based semiconductor laser device 5000 according to a fifth embodiment of the present invention is described with reference to FIG. 7 and FIG. 8. An ultraviolet semiconductor laser whose lasing wavelength $\lambda$ is about 365 nm is employed in this fifth embodiment, dissimilarly to the aforementioned first embodiment.

Figure 7:
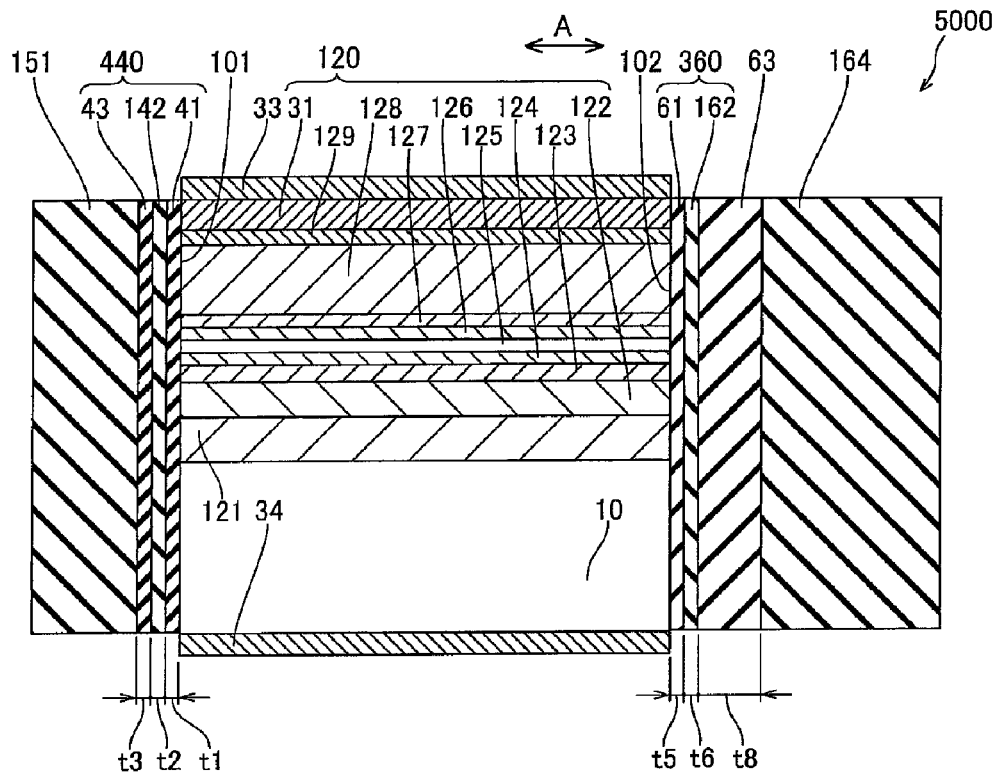
FIG. 7 A sectional view of a semiconductor laser device on a surface along a cavity direction, for illustrating the structure of a semiconductor laser device according to a fifth embodiment of the present invention.

According to the fifth embodiment, a first alteration preventing layer 440 which is such a dielectric multilayer film that an AlN film 41 having a thickness of about 10 nm in contact with a light emitting surface 101, an $HfO_2$ film 142 having a thickness of about 10 nm in contact with the AlN film 41 and an AlN film 43 having a thickness of about 10 nm in contact with the $HfO_2$ film 142 are stacked successively from the side closer to the light emitting surface 101 is formed on the light emitting surface 1 of the nitride-based semiconductor laser device 5000, as shown in FIG. 7. An $HfO_2$ film 151 having a thickness of about 100 nm is formed on the first alteration preventing layer 440, to be in contact with the first alteration preventing layer 440. The first alteration preventing layer 440 is an example of the "first insulating film" in the present invention. The $HfO_2$ film 142 is an example of the "first oxide film" or the "first intermediate film" in the present invention, and the $HfO_2$ film 151 is an example of the "second oxide film" or the "second insulating film" in the present invention. The light emitting surface 101 is set to have a reflectance of about 8% for a laser beam due to the $HfO_2$ film 151.

According to the fifth embodiment, the thickness t1 (=about 10 nm) of the AlN film 41, the thickness t2 of the $HfO_2$ film 142 and the thickness t3 (=about 10 nm) of the AlN film 43 are set to have the relations of $t1<\lambda/(4\times n1)$, $t2<\lambda/(4\times n2)$ and $t3<\lambda/(4\times n3)$ respectively when the refractive indices of the AlN film 41, the $HfO_2$ film 142 and the AlN film 43 are n1 (=about 2.15), n2 (=about 1.95) and n3 (=about 2.15) respectively.

In other words, the AlN film 41 is preferably so formed that the thickness t1 thereof is t1<about 42 nm in a semiconductor element layer 120 having the lasing wavelength $\lambda$ of about 365 nm, according to the fifth embodiment. The AlN film 43 is preferably so formed that the thickness t3 thereof is t3<about 42 nm. The nitride films (AlN films 41 and 43) are more preferably formed to have thicknesses in the range of about 1 nm to about 20 nm. The $HfO_2$ film 142 is preferably so formed that the thickness t2 thereof is t2<about 47 nm, and more preferably has a thickness in the range of about 1 nm to about 20 nm, in particular.

As shown in FIG. 7, a second alteration preventing layer 360 which is such a dielectric multilayer film that an AlN film 61 having a thickness of about 10 nm in contact with a light reflecting surface 102 and an $HfO_2$ film 162 having a thickness of about 10 nm in contact with the AlN film 61 are stacked successively from the side closer to the light reflecting surface 102 is formed on the light reflecting surface 102 of the nitride-based semiconductor laser device 5000. An $SiO_2$ film 63 having a thickness of about 100 nm in contact with the $HfO_2$ film 162 is formed on the second alteration preventing layer 360. A multilayer reflecting film 164 which is such a dielectric multilayer film having a thickness of about 880 nm that eight $SiO_2$ films each having a thickness of about 70 nm as a low refractive index film in contact with the $SiO_2$ film and eight $HfO_2$ films each having a thickness of about 40 nm as a high refractive index film are alternately stacked is formed on the $SiO_2$ film 63. The light reflecting surface 102 is set to have a high reflectance of about 98% for the laser beam due to the multilayer reflecting film 164.

According to the fifth embodiment, the thickness t5 (=about 10 nm) of the AlN film 61, the thickness t6 (=about 10 nm) of the $HfO_2$ film 162 and the thickness t8 (=about 100 nm) of the $SiO_2$ film 63 are set to have the relations of $t5<\lambda/(4\times n5)$, $t6<\lambda/(4\times n6)$ and $t8<\lambda/(2\times n8)$ respectively when the refractive indices of the AlN film 61, the $HfO_2$ film 162 and the $SiO_2$ film 63 are n5 (=about 2.15), n6 (=about 1.95) and n8 (=about 1.48) respectively.

Figure 8:
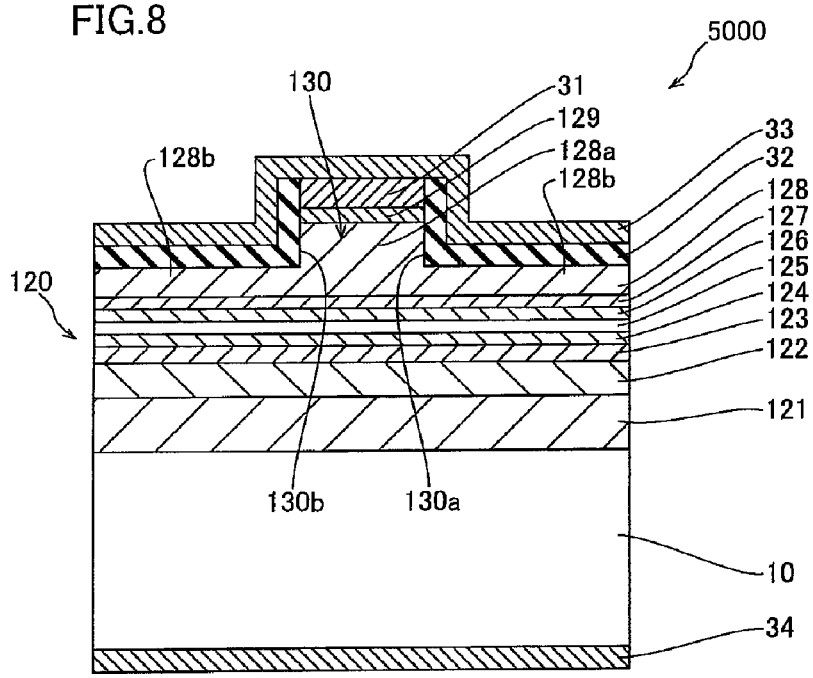
FIG. 8 A sectional view of the nitride-based semiconductor laser device shown in FIG. 7 on a surface orthogonal to the cavity direction.

In the semiconductor element layer 120 of the nitride-based semiconductor laser device 5000, an n-type layer 121, having a thickness of about 100 nm, made of n-type GaN doped with Ge having a doping quantity of about $5\times10^{18}$ cm$^{-3}$ is formed on the upper surface of a substrate 10 made of n-type GaN, as shown in FIG. 8. Further, an n-type cladding layer 122, having a thickness of about 700 nm, made of n-type $Al_{0.10}Ga_{0.90}N$ doped with Ge having a doping quantity of about $5\times10^{18}$ cm$^{-3}$ and a carrier concentration of about $5\times10^{18}$ cm$^{-3}$ is formed on the n-type layer 121.

An n-side carrier blocking layer 123 made of undoped $Al_{0.20}Ga_{0.80}N$ having a thickness of about 10 nm is formed on the n-type cladding layer 122. An n-type light guide layer 124, having a thickness of about 150 nm, made of n-type $Al_{0.03}Ga_{0.97}N$ doped with Ge having a doping quantity of about $5\times10^{18}$ cm$^{-3}$ and a carrier concentration of about $5\times10^{18}$ cm$^{-3}$ is formed on the n-side carrier blocking layer 123. An active layer 125 is formed on the n-type light guide layer 124. This active layer 125 has an SQW structure in which two barrier layers made of undoped $Al_{0.06}Ga_{0.94}N$ each having a thickness of about 10 nm and a single well layer made of undoped GaN having a thickness of 18 nm are alternately stacked.

As shown in FIG. 8, a P-type light guide layer 126, having a thickness of about 150 nm, made of p-type $Al_{0.03}Ga_{0.97}N$ doped with Mg having a doping quantity of about $3\times10^{19}$ $cm^{-3}$ and a carrier concentration of about $7\times10^{17}$ $cm^{-3}$ is formed on the active layer 125. A p-side carrier blocking layer 127, having a thickness of about 10 nm, made of undoped $Al_{0.20}Ga_{0.80}N$ is formed on the p-type light guide layer 126.

A p-type cladding layer 128, having a projecting portion 128a and a planar portion 128b other than the projecting portion 128a, made of p-type $Al_{0.10}Ga_{0.90}N$ doped with Mg having a doping quantity of about $3\times10^{19}$ $cm^{-3}$ and a carrier concentration of about $7\times10^{17}$ $cm^{-3}$ is formed on the p-side carrier blocking layer 127. The planar portion 128b of this p-type cladding layer 128 has a thickness of about 80 nm on the right and left sides of the projecting portion 128a. The p-type cladding layer 128 has a height of about 320 nm from the upper surface of the planar portion 128b to the upper surface of the projecting portion 128a, while the projecting portion 128a has a width of about 1.5 μm.

A p-type contact layer 129, having a thickness of about 10 nm, made of p-type $In_{0.02}Ga_{0.98}N$ doped with Mg having a doping quantity of about $4\times10^{19}$ $cm^{-3}$ and a carrier concentration of about $5\times10^{17}$ $cm^{-3}$ is formed on the projecting portion 128a of the p-type cladding layer 128. A ridge portion 130 having one side surface 130a and another side surface 130b positioned on the side opposite to the side surface 130a is constituted of this p-type contact layer 129 and the projecting portion 128a of the p-type cladding layer 128. The ridge portion 130 has a width of about 1.5 μm on the lower portion, and is formed in a shape extending in a [1-100] direction (direction A in FIG. 7 which is the outgoing direction of the laser beam). A waveguide extending in the [1-100] direction (direction A in FIG. 7) is formed on a portion including the active layer 125 positioned under the ridge portion 130, and a cavity is constituted of this waveguide, the light emitting surface 101 and the light reflecting surface 102. The n-type layer 121, the n-type cladding layer 122, the n-side carrier blocking layer 123, the n-type light guide layer 124, the active layer 125, the p-type light guide layer 126, the p-side carrier blocking layer 127, the p-type cladding layer 128 and the p-type contact layer 129 are examples of the "semiconductor element layer" in the present invention respectively. The active layer 125 is an example of the "light emitting layer" in the present invention.

The remaining structure of and a manufacturing process for the nitride-based semiconductor laser device 5000 according to the fifth embodiment are similar to those of the aforementioned first embodiment.

According to the fifth embodiment, as hereinabove described, the $HfO_2$ films 142 and 151 are employed as a first oxide film and a second oxide film of a facet coating film formed on the light emitting surface 101 respectively, in place of the $Al_2O_3$ film 42 and the $Al_2O_3$ film 51 employed in the first embodiment. The absorption edge of $HfO_2$ is below the ultraviolet region (λ=not more than about 300 nm), and hence light absorption on the facet coating film formed on the light emitting surface 101 can be suppressed in the nitride-based semiconductor laser device 5000 emitting ultraviolet light (λ=365 nm), whereby the light can be efficiently extracted from the light emitting surface 101.

According to the fifth embodiment, the $HfO_2$ film 162 is employed in the second alteration preventing layer 360 of the facet coating film formed on the light reflecting surface 102 in place of the $Al_2O_3$ film 62 employed in the first embodiment, while the $HfO_2$ films are employed also in the multilayer reflecting film 164 in place of the $Al_2O_3$ films employed in the first embodiment. Thus, light absorption on the facet coating film formed on the light reflecting surface 102 can be suppressed similarly to the facet coating film formed on the light emitting surface 101, whereby light can be efficiently reflected on the light reflecting surface 102.

The film stress of an $HfO_2$ film can be easily rendered smaller than the film stress of $Al_2O_3$, whereby peeling on the respective facet coating films formed on the light emitting surface 101 and the light reflecting surface 102 can be further suppressed. Further, the film stress of an $HfO_2$ film can be easily rendered larger than the film stress of $Al_2O_3$, whereby alteration caused when a high-energy laser beam is applied can be further suppressed. Consequently, the reliability of the nitride-based semiconductor laser device 5000 can be further improved. The remaining effects of the fifth embodiment are similar to those of the aforementioned first embodiment.

The embodiments disclosed this time must be considered as illustrative in all points and not restrictive. The range of the present invention is shown not by the above description of the embodiments but by the scope of claims for patent, and all modifications within the meaning and range equivalent to the scope of claims for patent are included.

For example, while the example constituting the semiconductor element layer 20 (120) of the nitride-based semiconductor layers has been shown in each of the aforementioned first to fifth embodiments, the present invention is not restricted to this, but the semiconductor element layer may be constituted of semiconductor layers other than the nitride-based semiconductor layers.

While the example of forming the first nitride film (AlN film 41) and the second nitride film (AlN film 43) by the AlN films respectively has been shown in each of the aforementioned first to fifth embodiments, the present invention is not restricted to this, but the aforementioned first and second nitride films may be made of nitrides containing an Si element or the like. In the case of this modification, nitride films made of $Si_3N_4$ can be employed for the first nitride film and the second nitride film respectively, for example. In this case, the first nitride film and the second nitride film have refractive indices of about 2.1, and hence the first nitride film and the second nitride film are preferably so formed that the thicknesses t thereof are t<about 48 nm, and more preferably have thicknesses in the range of about 1 nm to about 20 nm, in particular.

While the example of forming both of the first nitride film (AlN film 41) and the second nitride film (AlN film 43) by the AlN films has been shown in each of the aforementioned first to fifth embodiments, the present invention is not restricted to this, but the first nitride film and the second nitride film may be formed by nitride films containing different metallic elements.

While the example of forming the first oxide film ($Al_2O_3$ film 42) by the $Al_2O_3$ film has been shown in each of the aforementioned first and third embodiments, the present invention is not restricted to this, but the aforementioned first oxide film may be made of an oxide containing an Si element, a Zr element, a Ta element, an Hf element or an Nb element. When forming the first oxide film by an $SiO_2$ film having a refractive index of about 1.48 in this modification, the first oxide film is preferably so formed that the thickness t thereof is t<about 68 nm. When forming the first oxide film by a $ZrO_2$ film having a refractive index of about 2.28, the first oxide film is preferably so formed that the thickness t thereof is t<about 44 nm. When forming the first oxide film by a $Ta_2O_5$ film having a refractive index of about 2.25, the first oxide film is preferably so formed that the thickness t thereof is t<about 45 nm. When forming the first oxide film by an $HfO_2$ film having a refractive index of about 1.95, the first oxide film is preferably so formed that the thickness t thereof is t<about 47 nm.

When forming the first oxide film by an $Nb_2O_5$ film having a refractive index of about 2.35, the first oxide film is preferably so formed that the thickness t thereof is t<about 43 nm. Each first oxide film illustrated in the above is also more preferably formed to have a thickness in the range of about 1 nm to about 20 nm, in particular.

While the example of forming the first oxynitride film (AlON film 44) by the AlON film has been shown in the aforementioned second embodiment, the present invention is not restricted to this, but the aforementioned oxynitride film may be formed by an oxynitride film containing an Si element or the like. When forming the first oxynitride film by an oxynitride film made of $SiO_xN_y$ (hereinafter referred to as SiON), for example, the refractive index of SiON is decided in the range of about 1.48 to about 2.1 due to the mixing ratio between $SiO_2$ and $Si_3N_4$, and hence the first oxynitride film is preferably so formed that the thickness t thereof is in the range of t<about 48 nm ($SiO_2$ is about 100%) to about 68 nm ($Si_3N_4$ is about 100%), and more preferably formed to have a thickness in the range of about 1 nm to about 20 nm, in particular.

While the example of constituting the first intermediate film formed between the first nitride film (AlN film 41) and the second nitride film (AlN film 43) of the first oxide film ($Al_2O_3$ film 82) and the two first oxynitride films (AlON films 81 and 83) holding the first oxide film therebetween in the stacking direction has been shown in the aforementioned fourth embodiment, the present invention is not restricted to this, but the first intermediate film may be in another combination including both of a first oxide film and a first oxynitride film, such that the first intermediate film includes a single first oxide film and a single first oxynitride film, for example.

While the example of forming the third oxynitride film (AlON film 45) between the second nitride film (AlN film 43) and the second oxide film ($Al_2O_3$ film 51) as the second intermediate film has been shown in the aforementioned second embodiment, the present invention is not restricted to this, but an oxide film such as an $Al_2O_3$ film or an $SiO_2$ film may be formed as the second intermediate film. The oxide film such as an $Al_2O_3$ film or an $SiO_2$ film employed as the second intermediate film is an example of the "third oxide film" in the present invention. Alternatively, this second intermediate film may include both of a third oxynitride film and the aforementioned third oxide film.

While the example of forming both of the first oxynitride film (AlON film 44) and the third oxynitride film (AlON film 45) by the AlON films has been shown in the aforementioned second embodiment, the present invention is not restricted to this, but the first oxynitride film and the third oxynitride film may be formed by oxynitride films containing different metallic elements.

While the example of employing the $Al_2O_3$ film 51 or the $SiO_2$ film 52 which is an oxide film as the second insulating film controlling the reflectance of the light emitting surface 1 has been shown in each of the aforementioned first to fourth embodiments, the present invention is not restricted to this, but an AlON film or an SiON film which is an oxynitride film may be employed for the second insulating film. The oxynitride film such as an AlON film or an SiON film employed as the second insulating film is an example of the "second oxynitride film" in the present invention. Alternatively, the second insulating film may be so formed as to include both of a second oxide film and the aforementioned second oxynitride film.

While the example of setting the thickness of the $Al_2O_3$ film 51 controlling the reflectance of the light emitting surface 1 to about 70 nm or about 73 nm (about 60 nm in the second embodiment) has been shown in each of the aforementioned first to fourth embodiments, the present invention is not restricted to this, but the $Al_2O_3$ film 51 may be formed to have a thickness other than the above.

While the example of setting the thickness of the $SiO_2$ film 52 controlling the reflectance of the light emitting surface 1 to about 70 nm has been shown in the first modification of the aforementioned first embodiment, the present invention is not restricted to this, but the $SiO_2$ film 52 may be formed to have a thickness other than the above.

While the example of forming the third nitride film (AlN film 61) and the fourth nitride film (AlN film 73) by the AlN films respectively has been shown in the aforementioned third embodiment, the present invention is not restricted to this, but the aforementioned third and fourth nitride films may be made of nitrides containing an Si element or the like. Also in the case of this modification, nitride films made of $Si_3N_4$ can be employed for the third nitride film and the fourth nitride film respectively, for example. In this case, the third nitride film and the fourth nitride film have refractive indices of about 2.1, and hence the third nitride film and the fourth nitride film are preferably so formed that the thicknesses t thereof are t<about 48 nm, and more preferably have thicknesses in the range of about 1 nm to about 20 nm, in particular.

While the example of forming both of the third nitride film (AlN film 61) and the fourth nitride film (AlN film 73) by the AlN films has been shown in the aforementioned third embodiment, the present invention is not restricted to this, but the third nitride film and the fourth nitride film may be formed by nitride films containing different metallic elements.

While the example of forming the fourth oxide film ($Al_2O_3$ film 62) by the $Al_2O_3$ film has been shown in the aforementioned third embodiment, the present invention is not restricted to this, but the aforementioned fourth oxide film may be made of an oxide containing an Si element, a Zr element, a Ta element, an Hf element or an Nb element, similarly to the first oxide film ($Al_2O_3$ film 42) of the aforementioned first embodiment. In this case, the thickness of the fourth oxide film can be set similarly to the first oxide film of the aforementioned first embodiment.

While the example of forming the fourth oxide film ($Al_2O_3$ film 62) held between the third nitride film (AlN film 61) and the fourth nitride film (AlN film 73) has been shown in the aforementioned third embodiment, the present invention is not restricted to this, but a third intermediate film consisting of an oxynitride film such as an AlON film or an SiON film may be formed between the third nitride film and the fourth nitride film. The oxynitride film such as an AlON film or an SiON film employed as the third intermediate film is an example of the "fourth oxynitride film" in the present invention. Also in the case of this modification similarly to the aforementioned second embodiment, the fourth oxynitride film is preferably so formed that the thickness t thereof is in the range of t<about 47 nm to about 60 nm, and more preferably has a thickness in the range of about 1 nm to about 20 nm in particular, when the aforementioned fourth oxynitride film is made of AlON, for example. When the aforementioned fourth oxynitride film is made of SiON, the fourth oxynitride film is preferably so formed that the thickness t thereof is in the range of t<about 48 nm $SiO_2$ is about 100%) to about 68 nm ($Si_3N_4$ is about 100%), and more preferably has a thickness in the range of about 1 nm to about 20 nm, in particular. Also according to this structure, the insulating property of the aforementioned AlON film or the SiON film can be improved since an oxynitride containing Al or Si has an excellent insulating property. Further, in a case of holding the AlON film between the third nitride film and the fourth nitride film containing an Al element from both sides, the respective films contain the common element (Al), and hence adhesiveness between the respective films can be improved.

While the case of constituting the third intermediate film held between the third nitride film (AlN film 61) and the fourth nitride film (AlN film 73) of the fourth oxide film ($Al_2O_3$ film 62) has been shown in the aforementioned third embodiment, the present invention is not restricted to this, but the third intermediate film may include both of the fourth oxide film and the aforementioned fourth oxynitride film.

While the case of forming the multilayer reflecting film 64 controlling the reflectance on the side of the light reflecting surface 2 by alternately stacking six $SiO_2$ films and six $ZrO_2$ films has been shown in each of the aforementioned first to fourth embodiments, the present invention is not restricted to this, but the $SiO_2$ films and the $ZrO_2$ films may be alternately stacked in numbers other than six. Further, different two types of insulating films having other refractive indices other than the $SiO_2$ films and the $ZrO_2$ films may be combined as the multilayer reflecting film.

While the example of forming the first oxide film ($HfO_2$ film 142) and the second oxide film ($HfO_2$ film 162) of the facet coating film on the light emitting surface 101 of the ultraviolet semiconductor laser 5000 by the $HfO_2$ films has been shown in the aforementioned fifth embodiment, the present invention is not restricted to this, but the same may be made of an oxide ($Ta_2O_5$, MgO or $Y_2O_3$) or an oxynitride ($TaO_XN_Y$, $MgO_XN_Y$ or $YO_XN_Y$) containing a Ta element, an Mg element or a Y element, whose absorption edge is below the ultraviolet region ($\lambda$=not more than about 300 nm).

While the example of forming the oxide films in the second alteration preventing layer 360 and the multilayer reflecting film 164 of the facet coating film on the light reflecting surface 102 of the ultraviolet semiconductor laser 5000 by the $HfO_2$ films has been shown in the aforementioned fifth embodiment, the present invention is not restricted to this, but the same may be made of an oxide ($Ta_2O_5$, MgO or $Y_2O_3$) or an oxynitride ($TaO_XN_Y$, $MgO_XN_Y$ or $YO_XN_Y$) containing a Ta element, an Mg element or a Y element, whose absorption edge is below the ultraviolet region ($\lambda$=not more than about 300 nm), or a fluoride ($AlF_3$, $MgF_2$, $YF_2$ or $LaF$) containing an Al element, an Mg element, an Y element or an La element.

While the case of forming the multilayer reflecting film 164 controlling the reflectance of the light reflecting surface 102 by alternately stacking eight $SiO_2$ films and eight $HfO_2$ films has been shown in the aforementioned fifth embodiment, the present invention is not restricted to this, but the $SiO_2$ films and the $HfO_2$ films may be alternately stacked in numbers other than eight. Further, different two types of insulating films (an oxide or an oxynitride containing the aforementioned Ta element, an Mg element or an Y element and a fluoride containing an Al element, an Mg element, a Y element or an La element, for example) having other refractive indices other than the $SiO_2$ films and the $HfO_2$ films may be combined as the multilayer reflecting film.

The invention claimed is:

1. A semiconductor laser device comprising:
    a semiconductor element layer having a light emitting layer;
    a first cavity facet formed on an end portion on a light emitting side of a region of said semiconductor element layer including said light emitting layer;
    a first insulating film in which a first nitride film, a first intermediate film including at least one of a first oxide film and a first oxynitride film and a second nitride film are formed on said first cavity facet in this order from the side of said first cavity facet; and
    a second insulating film, formed on said first insulating film, including at least one of a second oxide film and a second oxynitride film, wherein
    the thickness t1 of said first nitride film, the thickness t2 of said first intermediate film and the thickness t3 of said second nitride film are set to be $t1<\lambda/(4\times n1)$, $t2<\lambda/(4\times n2)$ and $t3<\lambda/(4\times n3)$ respectively when the wavelength of a laser beam emitted by said light emitting layer is $\lambda$ and the refractive index of said first nitride film, the average refractive index of said first intermediate film and the refractive index of said second nitride film are n1, n2 and n3 respectively.

2. The semiconductor laser device according to claim 1, wherein
    said first nitride film is in contact with said semiconductor element layer.

3. The semiconductor laser device according to claim 1, wherein
    at least one of said first nitride film and said second nitride film contain a metallic element, and said first intermediate film contains the same metallic element as said metallic element of at least one of said first nitride film and said second nitride film.

4. The semiconductor laser device according to claim 1, wherein
    said first nitride film and said second nitride film contain at least one of Al and Si respectively.

5. The semiconductor laser device according to claim 1, wherein
    said first oxide film contains at least one element selected from the group consisting of Al, Si, Zr, Ta, Hf and Nb.

6. The semiconductor laser device according to claim 1, wherein
    said first oxynitride film contains at least one of Al and Si.

7. The semiconductor laser device according to claim 1, wherein
    a second intermediate film including at least one of a third oxide film and a third oxynitride film is further formed between said first insulating film and said second insulating film.

8. The semiconductor laser device according to claim 7, wherein
    said second intermediate film is so set that $t4<\lambda/(4\times n4)$ when the average refractive index thereof is n4 and the thickness is t4.

9. The semiconductor laser device according to claim 1, wherein said first intermediate film includes both of said first oxide film and said first oxynitride film.

10. The semiconductor laser device according to claim 1, wherein said first intermediate film consists of said first oxide film and two said first oxynitride films holding said first oxide film therebetween in the stacking direction.

11. The semiconductor laser device according to claim 1, further comprising:
    a second cavity facet formed on an end portion on a light reflecting side of the region of said semiconductor element layer including said light emitting layer, and
    a third insulating film in which a third nitride film, a third intermediate film including at least one of a fourth oxide film and a fourth oxynitride film and a fourth nitride film are formed on said second cavity facet in this order from the side of said second cavity facet.

12. The semiconductor laser device according to claim 11, wherein the thickness t5 of said third nitride film, the thickness t6 of said third intermediate film and the thickness t7 of said fourth nitride film are set to be $t5<\lambda/(4\times n5)$, $t6<\lambda/(4\times n6)$ and $t7<\lambda/(4\times n7)$ respectively when the refractive index of said third nitride film, the average refractive index of said third intermediate film and the refractive index of said fourth nitride film are n5, n6 and n7 respectively.

13. The semiconductor laser device according to claim 11, wherein said third nitride film is in contact with said semiconductor element layer.

14. The semiconductor laser device according to claim 11, wherein at least one of said third nitride film and said fourth nitride film and said third intermediate film contain the same metallic element.

15. The semiconductor laser device according to claim 11, wherein said third nitride film and said fourth nitride film contain at least one of Al and Si respectively.

16. The semiconductor laser device according to claim 11, wherein said fourth oxide film contains at least one element selected from the group consisting of Al, Si, Zr, Ta, Hf and Nb.

17. The semiconductor laser device according to claim 11, wherein said fourth oxynitride film contains at least one of Al and Si.

18. The semiconductor laser device according to claim 11, further comprising a multilayer reflecting film formed on said third insulating film.

19. The semiconductor laser device according to claim 1, wherein said semiconductor element layer is made of a nitride-based semiconductor.

20. The semiconductor laser device according to claim 1, wherein said first nitride film, said first intermediate film and said second nitride film have thicknesses in the range of at least 1 nm and not more than 20 nm respectively.

* * * * *